United States Patent
Kariya et al.

(10) Patent No.: US 11,380,399 B2
(45) Date of Patent: Jul. 5, 2022

(54) SEMICONDUCTOR MEMORY DEVICE

(71) Applicant: Kioxia Corporation, Tokyo (JP)

(72) Inventors: Nayuta Kariya, Yokkaichi (JP); Muneyuki Tsuda, Ichinomiya (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/201,080

(22) Filed: Mar. 15, 2021

(65) Prior Publication Data

US 2021/0358552 A1    Nov. 18, 2021

(30) Foreign Application Priority Data

May 18, 2020  (JP) .............................. JP2020-086915

(51) Int. Cl.
  *G11C 11/34*    (2006.01)
  *G11C 16/10*    (2006.01)
  (Continued)

(52) U.S. Cl.
  CPC .......... *G11C 16/10* (2013.01); *G11C 16/0483* (2013.01); *G11C 16/14* (2013.01);
  (Continued)

(58) Field of Classification Search
  CPC ..... G11C 16/10; G11C 16/0483; G11C 16/14; G11C 16/26; H01L 23/5226; H01L 27/11556; H01L 27/11582
  (Continued)

(56) References Cited

U.S. PATENT DOCUMENTS 7,782,675 B2   8/2010  Matsunaga et al.
8,193,571 B2   6/2012  Katsumata et al.
(Continued)

FOREIGN PATENT DOCUMENTS

JP   2019-054182 A   4/2019
JP   2020-042885 A   3/2020
(Continued)

OTHER PUBLICATIONS

Fujiwara et al., "3D Semicircular Flash Memory Cell: Novel Split-Gate Technology to Boost Bit Density", IEDM19, pp. 28.1.1-28.1.4, 2019.

*Primary Examiner* — Viet Q Nguyen
(74) *Attorney, Agent, or Firm* — Oblon, McClelland, Maier & Neustadt, L.L.P.

(57) ABSTRACT

A semiconductor memory device includes first conductive layers, second conductive layers, a semiconductor layer disposed between the first conductive layers and the second conductive layers, and a charge storage layer including a first part disposed between the first conductive layers and the semiconductor layer and a second part disposed between the second conductive layers and the semiconductor layer. This semiconductor memory device is configured to execute a first write operation in which a first program voltage is supplied to a third conductive layer which is one of the first conductive layers and a write pass voltage is supplied to a fourth conductive layer which is another of the first conductive layers, and a second write operation in which a second program voltage is supplied to the third conductive layer and to the fourth conductive layer.

18 Claims, 24 Drawing Sheets

(51) Int. Cl.
  *H01L 23/522* (2006.01)
  *H01L 27/11556* (2017.01)
  *G11C 16/26* (2006.01)
  *G11C 16/04* (2006.01)
  *G11C 16/14* (2006.01)
  *H01L 27/11582* (2017.01)

(52) U.S. Cl.
  CPC .......... *G11C 16/26* (2013.01); *H01L 23/5226* (2013.01); *H01L 27/11556* (2013.01); *H01L 27/11582* (2013.01)

(58) Field of Classification Search
  USPC ........................................ 365/185.28, 185.18
  See application file for complete search history.

(56) References Cited

U.S. PATENT DOCUMENTS

| | | | | |
|---|---|---|---|---|
| 8,902,657 | B2* | 12/2014 | Iwai | H01L 27/11582 |
| | | | | 365/185.11 |
| 9,299,438 | B2* | 3/2016 | Hara | G11C 29/28 |
| 9,780,170 | B2* | 10/2017 | Ota | G11C 5/025 |
| 9,852,797 | B2* | 12/2017 | Maeda | G11C 16/0483 |
| 9,927,171 | B2* | 3/2018 | Hudson | F25J 3/0233 |
| 9,984,754 | B2* | 5/2018 | Sakamoto | G11C 16/10 |
| 10,026,487 | B2 | 7/2018 | Chen et al. | |
| 10,236,254 | B1 | 3/2019 | Arai et al. | |
| 10,403,642 | B2* | 9/2019 | Matsuo | H01L 27/11582 |
| 10,424,384 | B2 | 9/2019 | Higashi et al. | |
| 10,643,723 | B2 | 5/2020 | Umezawa | |
| 10,868,037 | B2* | 12/2020 | Arai | H01L 27/11573 |
| 10,896,733 | B2* | 1/2021 | Kimura | G11C 16/3459 |
| 10,964,377 | B2* | 3/2021 | Kimura | G11C 16/32 |
| 10,991,431 | B2* | 4/2021 | Sakaguchi | H01L 27/11524 |
| 11,011,211 | B2* | 5/2021 | Komai | G11C 7/1048 |
| 2015/0262682 | A1 | 9/2015 | Futatsuyama et al. | |
| 2018/0006047 | A1 | 1/2018 | Cha | |
| 2020/0303382 | A1* | 9/2020 | Takashima | H01L 23/481 |
| 2021/0272640 | A1* | 9/2021 | Ogura | G11C 16/14 |
| 2021/0273055 | A1* | 9/2021 | Yanai | H01L 27/1157 |
| 2021/0287985 | A1* | 9/2021 | Shirai | H01L 23/5226 |
| 2021/0288038 | A1* | 9/2021 | Oga | H01L 25/50 |

FOREIGN PATENT DOCUMENTS

| | | |
|---|---|---|
| JP | 2021-026786 A | 2/2021 |
| JP | 2021-136374 A | 9/2021 |

\* cited by examiner

SEMICONDUCTOR MEMORY DEVICE

CROSS-REFERENCE TO RELATED APPLICATIONS

This application is based upon and claims the benefit of Japanese Patent Application No. 2020-086915, filed on May 18, 2020, the entire contents of which are incorporated herein by reference.

BACKGROUND

Field

Embodiments described herein relate generally to a semiconductor memory device.

Description of the Related Art

There has been known a semiconductor memory device that includes a substrate, a plurality of gate electrodes stacked in a direction intersecting with a surface of this substrate, a semiconductor layer opposed to the plurality of gate electrodes, and gate insulating layers disposed between the gate electrodes and the semiconductor layer. The gate insulating layer includes a memory unit configured to store data, such as an insulating charge storage layer, such as of silicon nitride ($Si_3N_4$), and a conductive charge storage layer, such as a floating gate.

DETAILED DESCRIPTION

Figure 1:
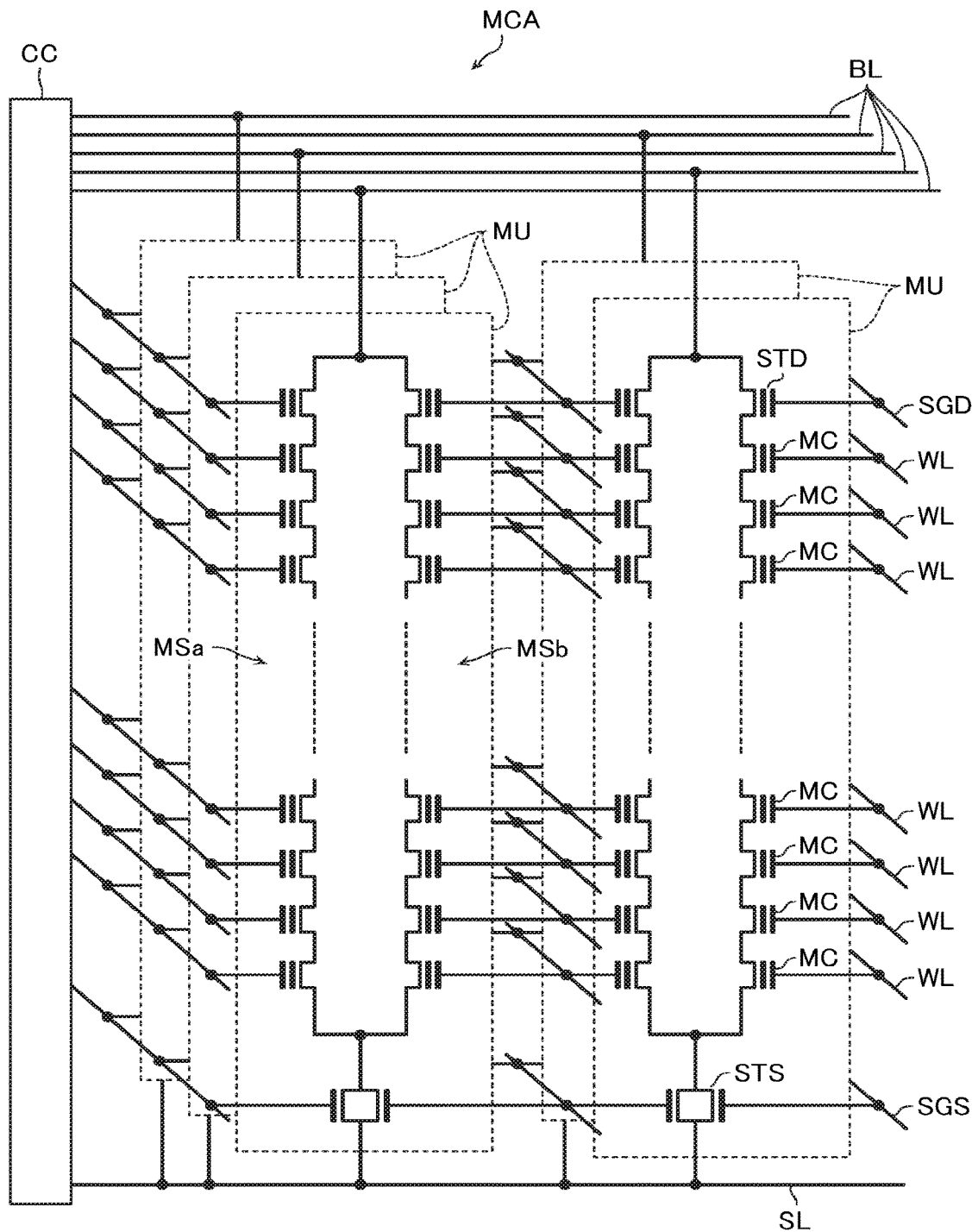
FIG. 1 is a schematic equivalent circuit diagram of a semiconductor memory device according to a first embodiment.

A semiconductor memory device according to one embodiment includes: a plurality of first conductive layers arranged in a first direction; a plurality of second conductive layers spaced from the plurality of first conductive layers in a second direction intersecting with the first direction, the second conductive layers being arranged in the first direction; a semiconductor layer disposed between the plurality of first conductive layers and the plurality of second conductive layers, the semiconductor layer extending in the first direction and opposing the plurality of first conductive layers and the plurality of second conductive layers; and a charge storage layer including a first part and a second part, the first part being disposed between the plurality of first conductive layers and the semiconductor layer, the second part being disposed between the plurality of second conductive layers and the semiconductor layer. The semiconductor memory device is configured to execute: a first write operation in which a first program voltage is supplied to a third conductive layer which is one of the plurality of first conductive layers, and a write pass voltage smaller than the first program voltage is supplied to a fourth conductive layer which is another of the plurality of first conductive layers; and a second write operation in which a second program voltage larger than the write pass voltage is supplied to the third conductive layer, and the second program voltage is supplied to the fourth conductive layer.

A semiconductor memory device according to one embodiment includes: a plurality of first conductive layers arranged in a first direction; a plurality of second conductive layers spaced from the plurality of first conductive layers in a second direction intersecting with the first direction, the second conductive layers being arranged in the first direction; a semiconductor layer disposed between the plurality of first conductive layers and the plurality of second conductive layers, the semiconductor layer extending in the first direction and opposing the plurality of first conductive layers and the plurality of second conductive layers; a charge storage layer including a first part and a second part, the first part being disposed between the plurality of first conductive layers and the semiconductor layer, the second part being disposed between the plurality of second conductive layers and the semiconductor layer; and a first wiring electrically connected to the semiconductor layer. The semiconductor memory device is configured to execute: a first write operation in which a first program voltage is supplied to a third conductive layer which is one of the plurality of first conductive layers, and a write pass voltage smaller than the first program voltage is supplied to a fourth conductive layer which is another of the plurality of first conductive layers; a second write operation in which the write pass voltage is supplied to the third conductive layer, and the first program voltage is supplied to the fourth conductive layer; and an erase operation in which an erase voltage larger than the write pass voltage is supplied to the first wiring, and a first voltage smaller than the erase voltage is supplied to the third conductive layer and the fourth conductive layer, and the semiconductor memory device is configured to execute a first sequence including the first write operation, the second write operation, and the erase operation.

A semiconductor memory device according to one embodiment includes: a plurality of first conductive layers arranged in a first direction; a plurality of second conductive layers spaced from the plurality of first conductive layers in a second direction intersecting with the first direction, the second conductive layers being arranged in the first direction; a semiconductor layer disposed between the plurality of first conductive layers and the plurality of second conductive layers, the semiconductor layer extending in the first direction and opposing the plurality of first conductive layers and the plurality of second conductive layers; and a charge storage layer including a first part and a second part, the first part being disposed between the plurality of first conductive layers and the semiconductor layer, the second part being disposed between the plurality of second conductive layers and the semiconductor layer. The semiconductor memory device is configured to execute a first read operation and a second read operation, in the first read operation: a first read voltage is supplied to a third conductive layer which is one of the plurality of first conductive layers; a read pass voltage larger than the first read voltage is supplied to a fourth conductive layer which is another of the plurality of first conductive layers; and the read pass voltage is supplied to a fifth conductive layer which is one of the plurality of first conductive layers, the fifth conductive layer being adjacent to the third conductive layer in the first direction, in the second read operation: a second read voltage smaller than the read pass voltage is supplied to the third conductive layer; the read pass voltage is supplied to the fourth conductive layer; and the second read voltage is supplied to the fifth conductive layer.

A semiconductor memory device according to one embodiment includes: a plurality of first conductive layers arranged in a first direction; a plurality of second conductive layers spaced separated from the plurality of first conductive layers in a second direction intersecting with the first direction, the second conductive layers being arranged in the first direction; a semiconductor layer disposed between the plurality of first conductive layers and the plurality of second conductive layers, the semiconductor layer extending in the first direction and opposing the plurality of first conductive layers and the plurality of second conductive layers; and a charge storage layer including a first part and a second part, the first part being disposed between the plurality of first conductive layers and the semiconductor layer, the second part being disposed between the plurality of second conductive layers and the semiconductor layer. The semiconductor memory device is configured to execute a first read operation and a second read operation, in the first read operation: a first read voltage is supplied to a third conductive layer which is one of the plurality of first conductive layers; a read pass voltage larger than the first read voltage is supplied to a fourth conductive layer which is another of the plurality of first conductive layers; the read pass voltage is supplied to a fifth conductive layer which is one of the plurality of first conductive layers, the third conductive layer being positioned between the fourth conductive layer and the fifth conductive layer; and a read blocking voltage smaller than the first read voltage is supplied to a sixth conductive layer which is one of the plurality of second conductive layers, the sixth conductive layer being arranged with the third conductive layer in the second direction, in the second read operation: a second read voltage larger than the first read voltage is supplied to the third conductive layer; the read pass voltage is supplied to the fourth conductive layer; the read blocking voltage is supplied to the fifth conductive layer; the second read voltage is supplied to the sixth conductive layer; the read blocking voltage is supplied to a seventh conductive layer which is one of the plurality of second conductive layers, the seventh conductive layer being arranged with the fourth conductive layer in the second direction; the read pass voltage is supplied to an eighth conductive layer which is one of the plurality of second conductive layers, the eighth conductive layer being arranged with the fifth conductive layer in the second direction.

Next, the semiconductor memory device according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to "semiconductor memory device," it may mean a memory die and may mean a memory system including a control die, such as a memory chip, a memory card, and a Solid State Drive (SSD). Further, it may mean a configuration including a host computer, such as a smartphone, a tablet terminal, and a personal computer.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the second configuration is connected to the third configuration via the first configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may correspond to any of the X-direction, the Y-direction, and the Z-direction and need not to correspond to these directions.

Expressions, such as "above" and "below," in this specification are based on the substrate. For example, a direction away from the substrate along the Z-direction is referred to as above and a direction approaching the substrate along the Z-direction is referred to as below. A lower surface and a lower end of a certain configuration mean a surface and an end portion on the substrate side of this configuration. An upper surface and an upper end of a certain configuration mean a surface and an end portion on a side opposite to the substrate of this configuration. A surface intersecting with the X-direction or the Y-direction is referred to as a side surface and the like.

First Embodiment

[Configuration]

FIG. 1 is a schematic equivalent circuit diagram of a semiconductor memory device according to the first embodiment.

The semiconductor memory device according to the embodiment includes a memory cell array MCA and a control circuit CC controlling the memory cell array MCA.

The memory cell array MCA includes a plurality of memory units MU. The plurality of memory units MU each include two memory strings MSa, MSb electrically independent from one another. One ends of these memory strings MSa, MSb are each connected to a drain side select transistor STD and connected to a common bit line BL via the drain side select transistors STD. The other ends of the memory strings MSa, MSb are connected to a common source side select transistor STS and connected to a common source line SL via the source side select transistor STS.

The memory strings MSa, MSb each include a plurality of memory cells MC connected in series. The memory cell MC is a field-effect type transistor that includes a semiconductor layer, a gate insulating layer, and a gate electrode. The semiconductor layer functions as a channel region. The gate insulating layer includes a charge storage layer that can store data. A threshold voltage of the memory cell MC changes according to an amount of electric charge in the charge storage layer. The gate electrode is a part of a word line WL.

The select transistor (STD, STS) is a field-effect type transistor that includes a semiconductor layer, a gate insulating layer, and a gate electrode. The semiconductor layer functions as a channel region. The gate electrode of the drain side select transistor STD is a part of a drain side select gate line SGD. The gate electrode of the source side select transistor STS is apart of a source side select gate line SGS.

The control circuit CC generates voltages required for, for example, a read operation, a write operation, and an erase operation and supplies the voltages to the bit lines BL, the source line SL, the word lines WL, and the select gate lines (SGD, SGS). The control circuit CC includes, for example, a plurality of transistors and wirings disposed on a substrate corresponding to the memory cell array MCA. Note that, for example, the control circuit CC may include a plurality of transistors and wirings disposed on a different substrate from the substrate corresponding to the memory cell array MCA.

Next, with reference to FIG. 2 and FIG. 3, a schematic exemplary configuration of the semiconductor memory device according to the embodiment will be described.

The semiconductor memory device according to the embodiment includes a semiconductor substrate 100 and the memory cell array MCA disposed above the semiconductor substrate 100. The memory cell array MCA also includes a plurality of stacked structures LS arranged in the Y-direction and trench structures AT disposed between the plurality of stacked structures LS. The stacked structure LS includes a plurality of conductive layers 110 stacked in the Z-direction. The trench structure AT includes a plurality of memory string structures MSS arranged in the X-direction. Each of the memory string structures MSS include a semiconductor layer 120 in an approximately closed-bottomed cylindrical shape extending in the Z-direction, a gate insulating layer 130 disposed between the stacked structure LS and the semiconductor layer 120, and an insulating layer 140 of silicon oxide (SiO$_2$) or the like disposed at the center of the semiconductor layer 120. Insulating layers 150 of silicon oxide (SiO$_2$) or the like are disposed between the plurality of memory string structures MSS arranged in the X-direction.

The semiconductor substrate 100 is a semiconductor substrate of single-crystal silicon (Si) or the like. The semiconductor substrate 100 has, for example, a double well structure that includes an n-type impurity layer on an upper surface of the semiconductor substrate and further includes a p-type impurity layer in this n-type impurity layer. On the surface of the semiconductor substrate 100, for example, the transistors, the wirings, and the like constituting at least a part of the control circuit CC (FIG. 1) may be disposed.

The conductive layer 110 is an approximately plate-shaped conductive layer extending in the X-direction, and for example, a stacked film of titanium nitride (TiN) and tungsten (W) or a conductive layer of polycrystalline silicon (Si) to which impurities are injected or the like. The respective conductive layers 110 function as the word lines WL and the gate electrodes of the memory cells MC (FIG. 1) or the drain side select gate line SGD and the gate electrode of the drain side select transistor STD (FIG. 1).

Below the plurality of conductive layers 110, for example, a conductive layer 111 that contains a material similar to that of the conductive layer 110 is disposed. The conductive layer 111 functions as the source side select gate line SGS and the gate electrode of the source side select transistor STS (FIG. 1).

Insulating layers 101 of silicon oxide (SiO$_2$) or the like are disposed between the plurality of conductive layers 110, between the lowermost layer of the conductive layers 110 and the conductive layer 111, and between the conductive layer 111 and the semiconductor substrate 100.

Figure 3:
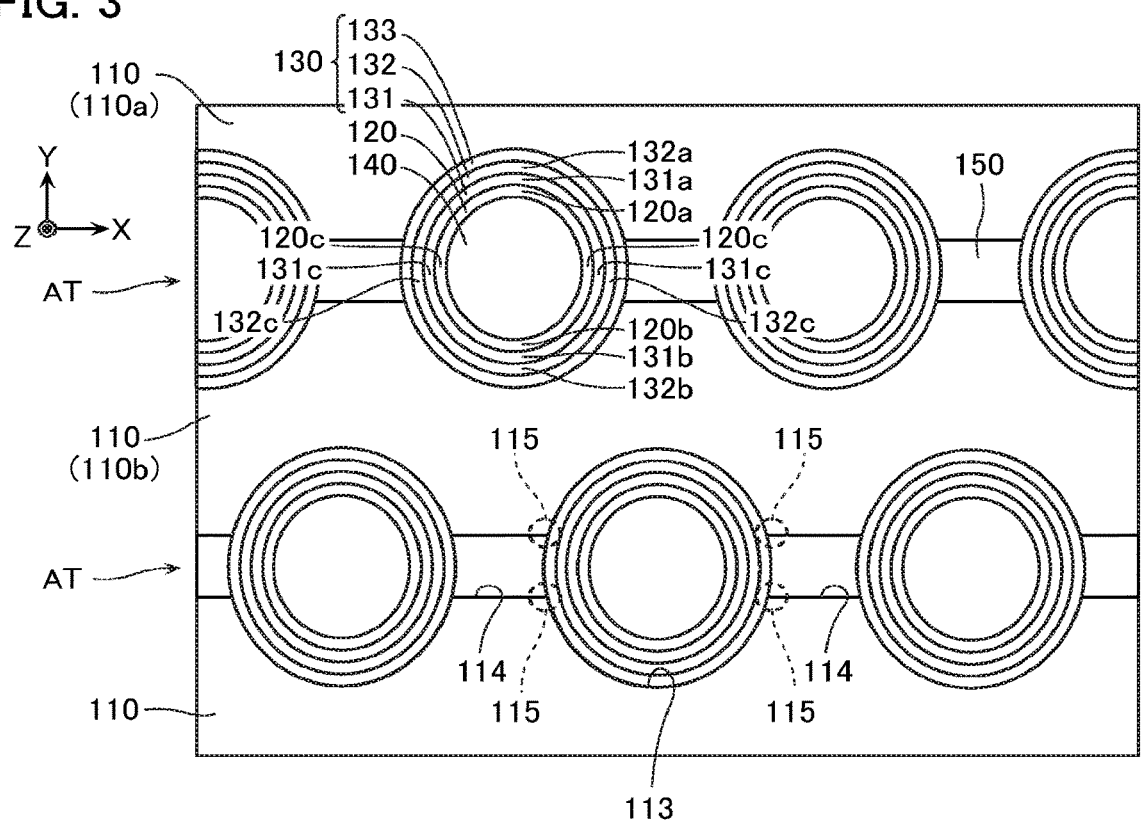
FIG. 3 is a schematic plan view of the semiconductor memory device according to the first embodiment.

Note that, in the example in FIG. 3, a contact surface 113 with the gate insulating layer 130 in the conductive layer 110 is formed into a curved line along an outer periphery of an approximately circular region (for example, a region in any shape including circular, ellipsoid, or ellipse shape) around a center axis of the insulating layer 140. A contact surface 114 with the insulating layer 150 in the conductive layer 110 is formed into a straight line extending in the X-direction. At a connecting portion between the contact surface 113 and the contact surface 114, a projecting portion 115 (a corner portion) projecting toward a side of the insulating layer 140 is formed.

When focusing on two stacked structures LS adjacent in the Y-direction, the plurality of conductive layers 110 included in one stacked structure LS may be hereinafter referred to as conductive layers 110a (FIG. 3). The plurality of conductive layers 110 included in the other stacked structure LS may be hereinafter referred to as conductive layers 110b (FIG. 3). The conductive layer 110a functions as the gate electrodes of the memory cells MC included in the memory string MSa or the gate electrode of the drain side select transistor STD included in the memory string MSa. The conductive layer 110b functions as the gate electrodes of the memory cells MC included in the memory string MSb or the gate electrode of the drain side select transistor STD included in the memory string MSb.

The semiconductor layer 120 is, for example, a semiconductor layer of non-doped polycrystalline silicon (Si) or the like. The semiconductor layer 120 has an approximately closed-bottomed cylindrical shape as described above. Note that, in the following description, in the semiconductor layer 120, a region opposed to the plurality of the conductive layers 110a may be referred to as a first region 120a (FIG. 3), a region opposed to the plurality of the conductive layers 110b may be referred to as a second region 120b (FIG. 3), and a region disposed between these first region 120a and second region 120b may be referred to as a third region 120c (FIG. 3). The first region 120a functions as channel regions of the plurality of memory cells MC and the drain side select transistor STD included in the memory string MSa (FIG. 1). The second region 120b functions as channel regions of the plurality of memory cell MC and the drain side select transistor STD included in the memory string MSb (FIG. 1).

The semiconductor layer 120 has a lower end to which a semiconductor layer 121 (FIG. 2) is connected. The semiconductor layer 121 is opposed to two conductive layers 111 adjacent in the Y-direction. The semiconductor layer 121 is a semiconductor layer of single-crystal silicon (Si) or the like, and functions as a channel region of the source side select transistor STS (FIG. 1). An insulating layer 123 of silicon oxide (SiO$_2$) or the like is disposed between the semiconductor layer 121 and the conductive layer 111.

Figure 2:
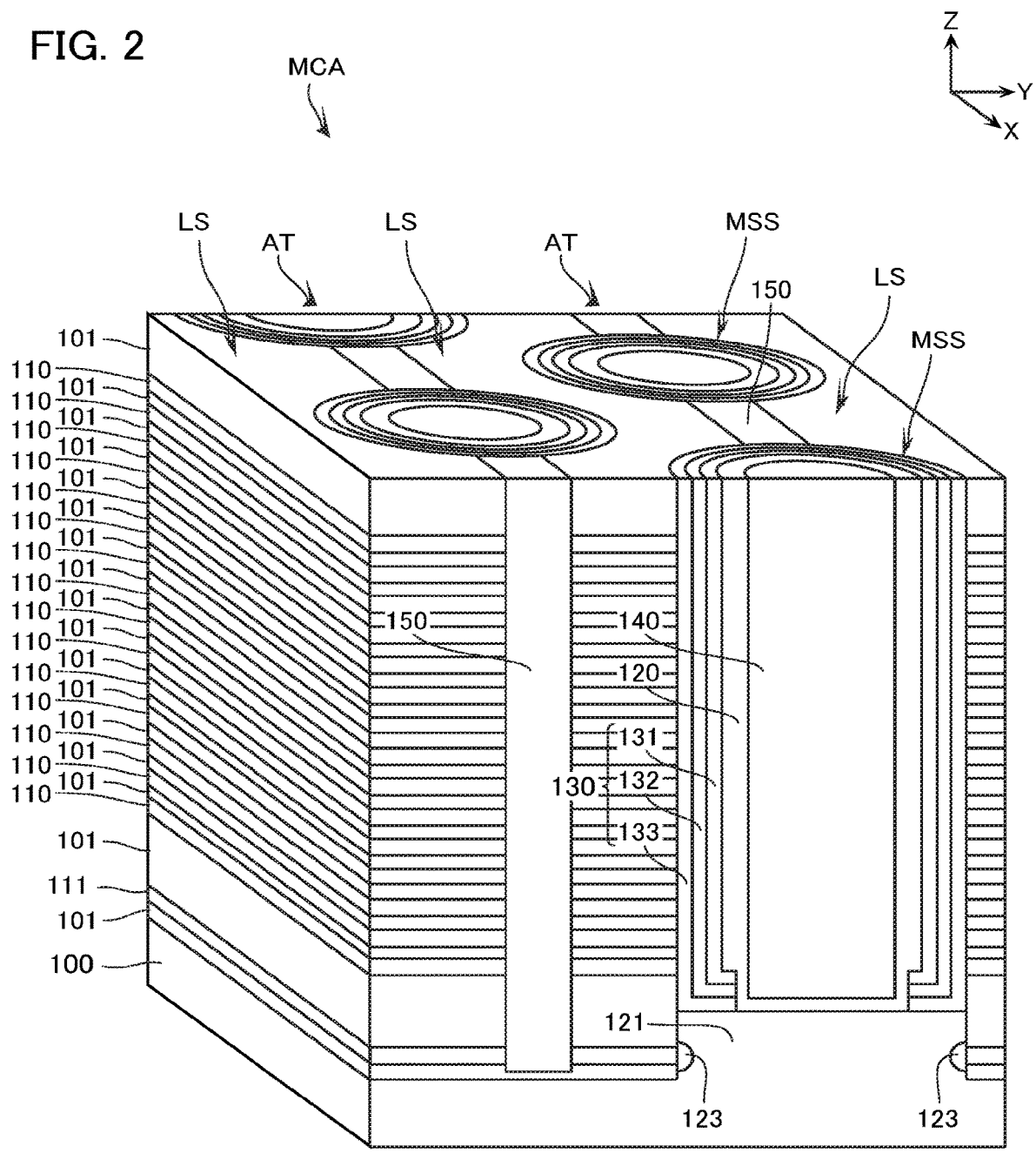
FIG. 2 is a schematic perspective view of the semiconductor memory device according to the first embodiment.

Note that, in the example in FIG. 2, the semiconductor substrate 100 functions as a part of the source line SL (FIG. 1), and the semiconductor layer 120 is electrically connected to the control circuit CC via the semiconductor layer 121 and the semiconductor substrate 100. However, such a configuration is merely an example, and the specific configuration is appropriately adjustable. For example, the semiconductor layer 121 may be omitted and a wiring or the like that functions as a part of the source line SL (FIG. 1) may be disposed below or above the memory cell array MCA, and the semiconductor layer 120 and the control circuit CC may be electrically connected via this wiring or the like.

The gate insulating layer 130, which has an approximately cylindrical shape, extends in the Z-direction along an outer peripheral surface of the semiconductor layer 120. The gate insulating layer 130 includes a tunnel insulating layer 131 of silicon oxide (SiO$_2$) or the like, a charge storage layer 132 of silicon nitride (SiN) or the like, and a block insulating layer 133 of silicon oxide (SiO$_2$) or the like, which are disposed from a side of the semiconductor layer 120 to a side of the conductive layer 110. Note that, in the following description, in the charge storage layer 132, a region disposed between the conductive layer 110a and the first region 120a of the semiconductor layer 120 may be referred to as a first region 132a (FIG. 3), a region disposed between the conductive layer 110b and the second region 120b of the semiconductor layer 120 may be referred to as a second region 132b (FIG. 3), and a region disposed between the insulating layer 150 and the third region 120c of the semiconductor layer 120 may be referred to as a third region 132c (FIG. 3). Similarly, in the following description, in the tunnel insulating layer 131, a region disposed between the above-described first region 120a and the first region 132a may be referred to as a first region 131a (FIG. 3), a region disposed between the above-described second region 120b and the second region 132b may be referred to as a second region 131b (FIG. 3), and a region disposed between the above-described third region 120c and the third region 132c may be referred to as a third region 131c (FIG. 3).

[Manufacturing Method]

Next, with reference to FIG. 4 to FIG. 18, a manufacturing method for the semiconductor memory device according to the embodiment will be described. FIG. 4, FIG. 6, FIG. 8, FIG. 10 to FIG. 14, and FIG. 16 to FIG. 18 are schematic cross-sectional views for describing the manufacturing method and illustrate a part of the structure illustrated in FIG. 2. FIG. 5, FIG. 7, FIG. 9, and FIG. 15 are schematic plan view for describing the manufacturing method and illustrate the structure illustrated in FIG. 3.

Figure 4:
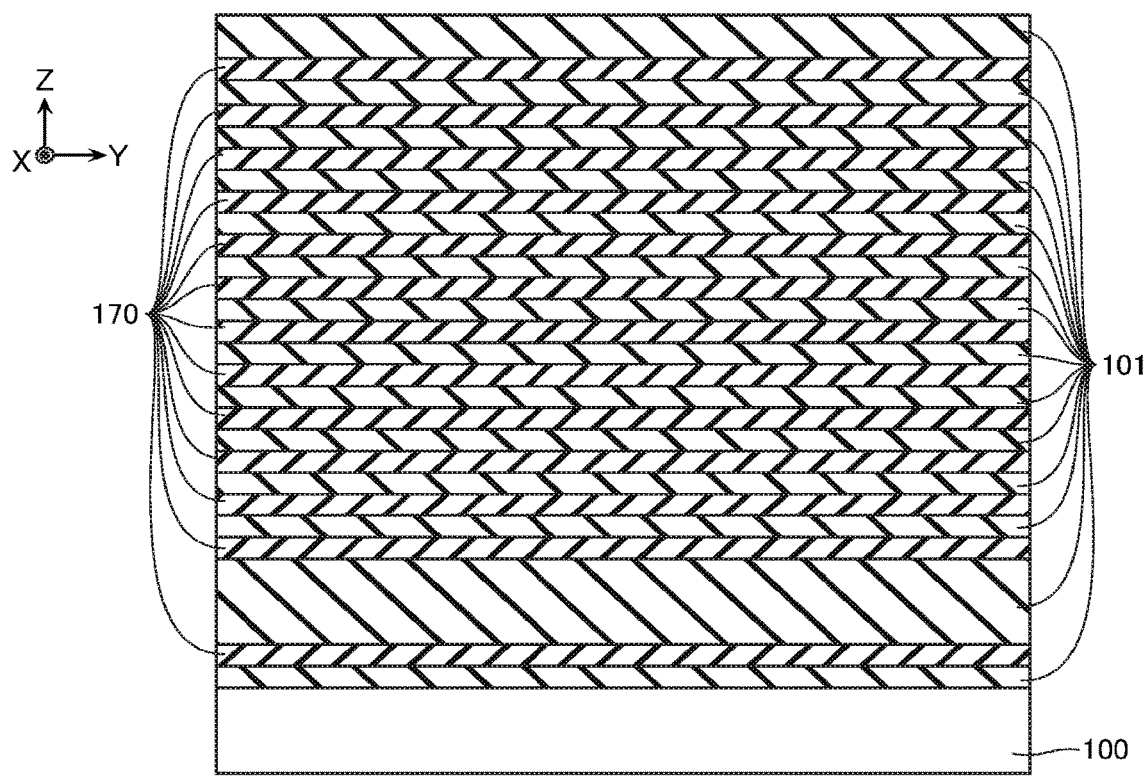
FIG. 4 is a schematic cross-sectional view illustrating a manufacturing method for the semiconductor memory device according to the first embodiment.

As illustrated in FIG. 4, in the manufacturing method, the plurality of insulating layers 101 and sacrifice layers 170 are stacked in alternation above the semiconductor substrate 100. The sacrifice layer 170 is made of, for example, silicon nitride ($Si_3N_4$). This process is performed by a method such as a Chemical Vapor Deposition (CVD).

Figure 5:
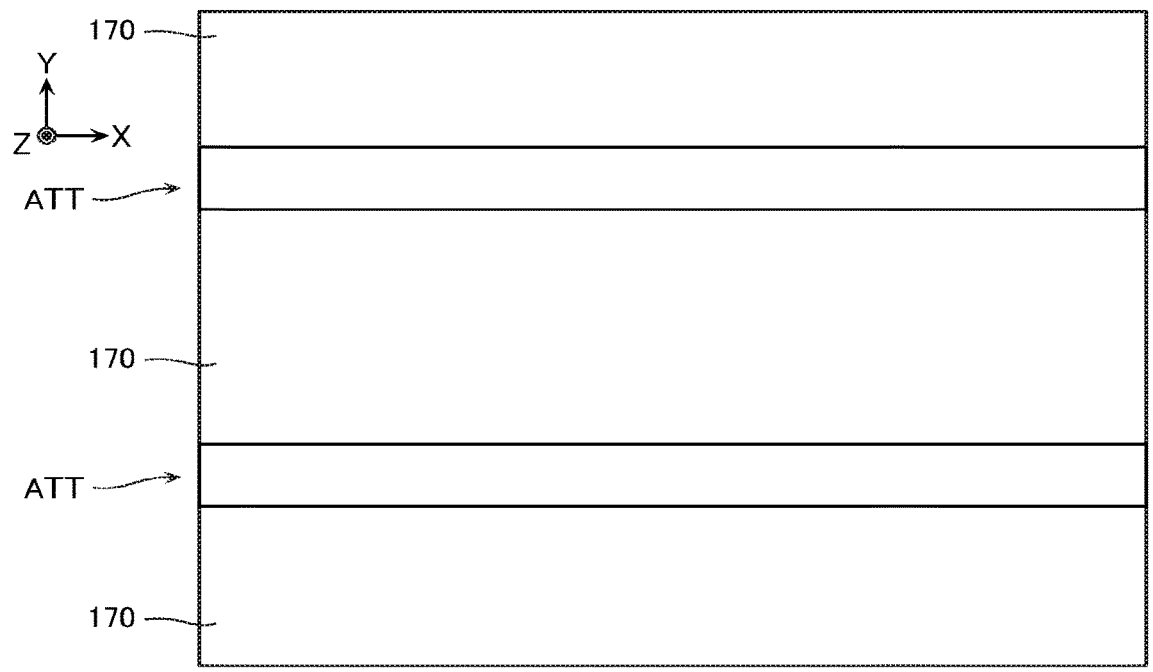
FIG. 5 is a schematic plan view illustrating the manufacturing method.
Figure 6:
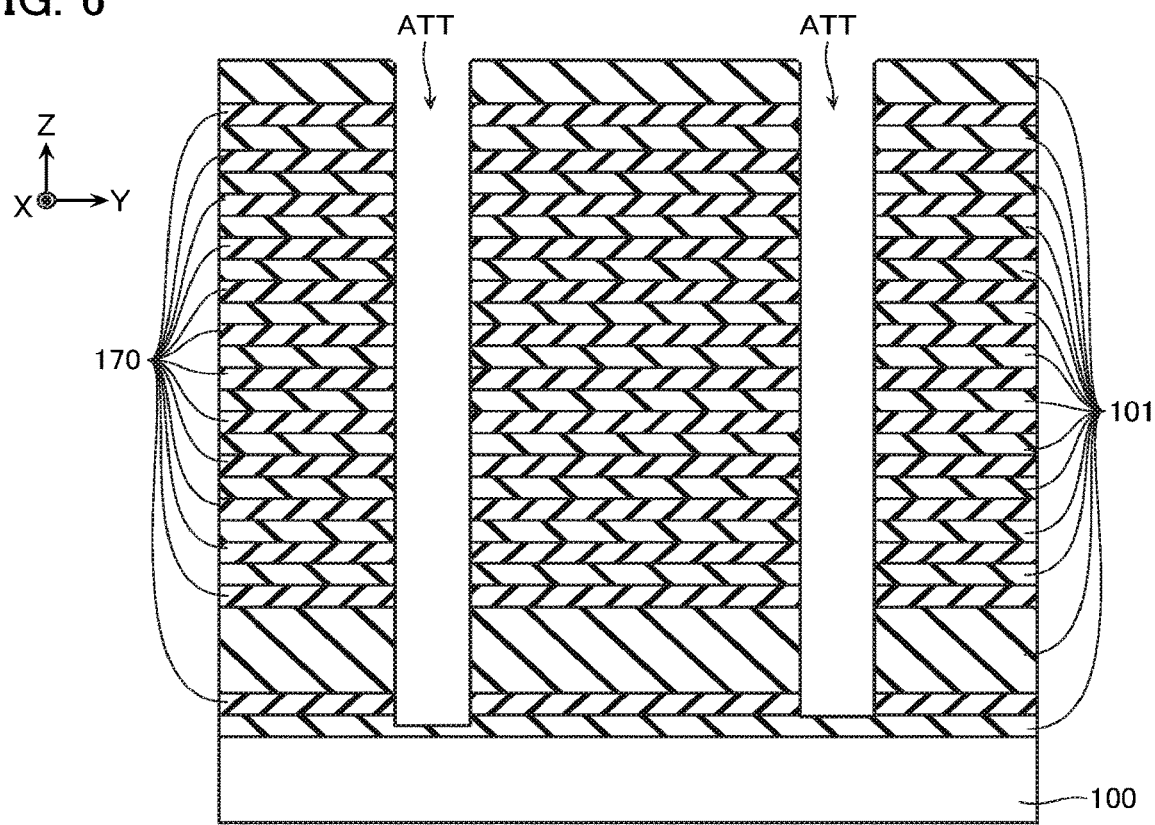
FIG. 6 is a schematic cross-sectional view illustrating the manufacturing method.

Next, as illustrated in FIG. 5 and FIG. 6, trenches ATT are formed in the insulating layers 101 and the sacrifice layers 170. In this process, for example, an insulating layer having openings at portions corresponding to the trenches ATT is formed on a top surface of the structure illustrated in FIG. 4, and Reactive Ion Etching (RIE) or the like is performed using the insulating layer as a mask. As illustrated in FIG. 5, the trench ATT extends in the X-direction. As illustrated in FIG. 6, the trench ATT extends in the Z-direction and passes through the plurality of insulating layers 101 and the sacrifice layers 170 to separate these configurations in the Y-direction.

Figure 7:
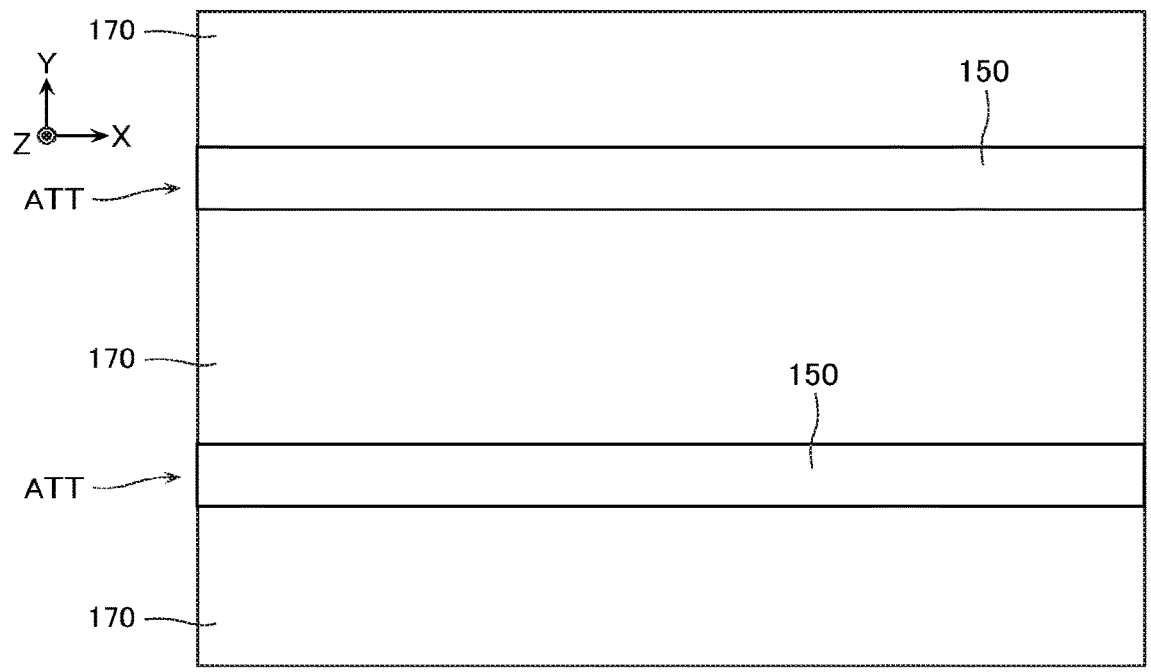
FIG. 7 is a schematic plan view illustrating the manufacturing method.
Figure 8:
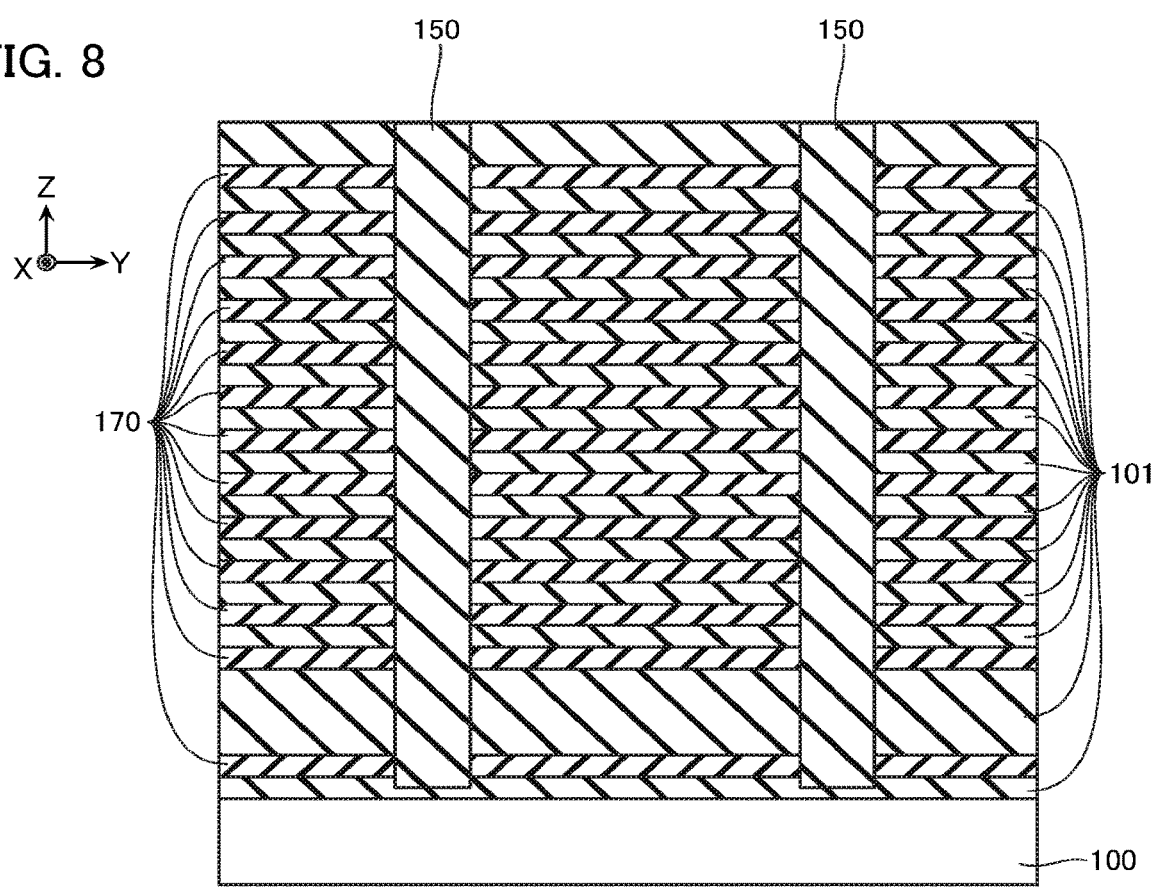
FIG. 8 is a schematic cross-sectional view illustrating the manufacturing method.

Next, as illustrated in FIG. 7 and FIG. 8, the insulating layers 150 are formed inside the trenches ATT. This process is performed by a method such as CVD.

Figure 9:
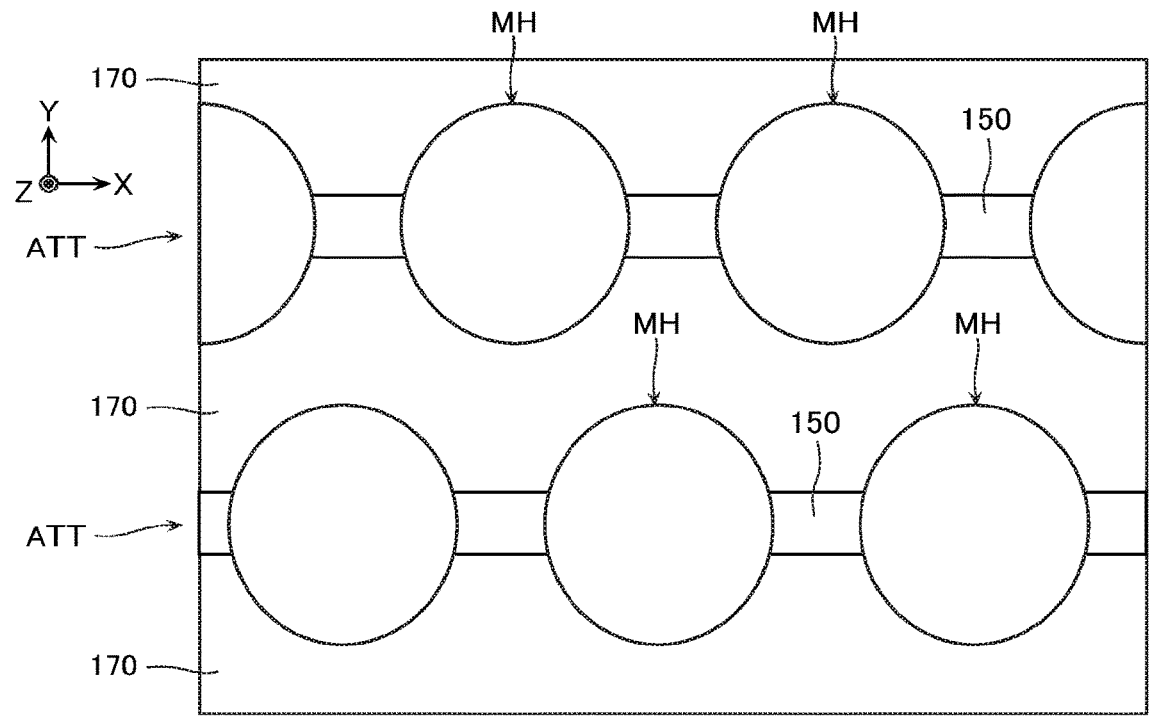
FIG. 9 is a schematic plan view illustrating the manufacturing method.
Figure 10:
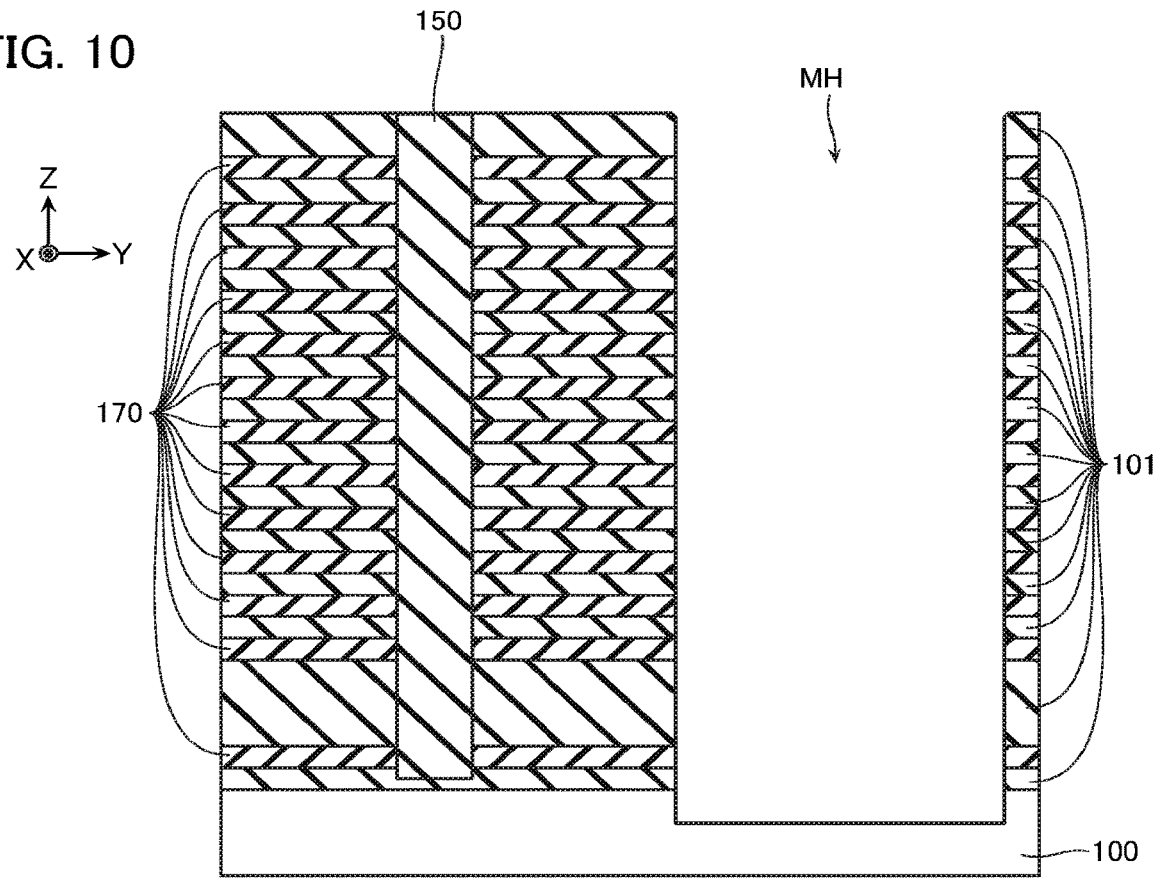
FIG. 10 is a schematic cross-sectional view illustrating the manufacturing method.

Next, as illustrated in FIG. 9 and FIG. 10, memory holes MH are formed in the insulating layers 101 and the sacrifice layers 170. In this process, for example, an insulating layer having openings at portions corresponding to the memory holes MH is formed on the top surface of the structure illustrated in FIG. 7 and FIG. 8, and RIE or the like is performed using the insulating layer as a mask. As illustrated in FIG. 9, the plurality of memory holes MH are arranged in the X-direction along the trench ATT. As illustrated in FIG. 10, the memory hole MH extends in the Z-direction and passes through the plurality of insulating layers 101 and the sacrifice layers 170 to expose a top surface of the semiconductor substrate 100.

Figure 11:
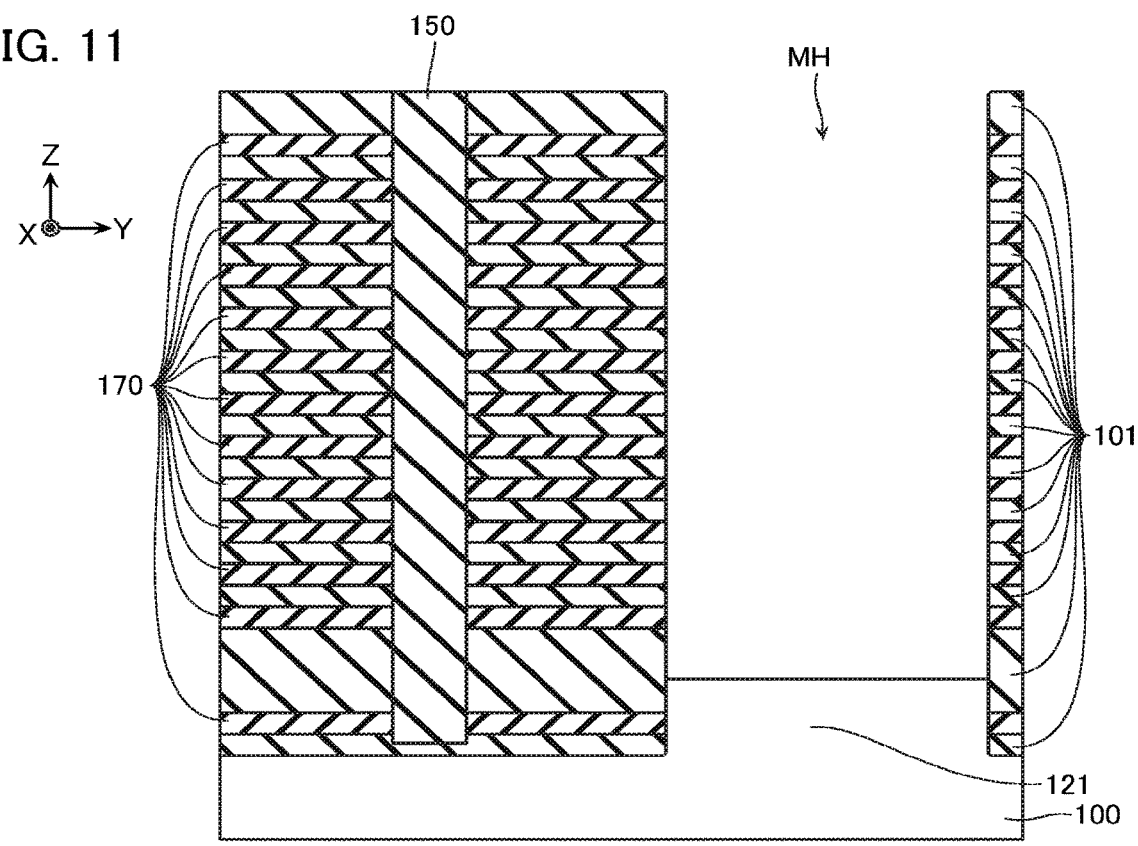
FIG. 11 is a schematic cross-sectional view illustrating the manufacturing method.

Next, as illustrated in FIG. 11, the semiconductor layer 121 is formed on a bottom surface of the memory hole MH. This process is performed by a method such as an epitaxial growth.

Figure 12:
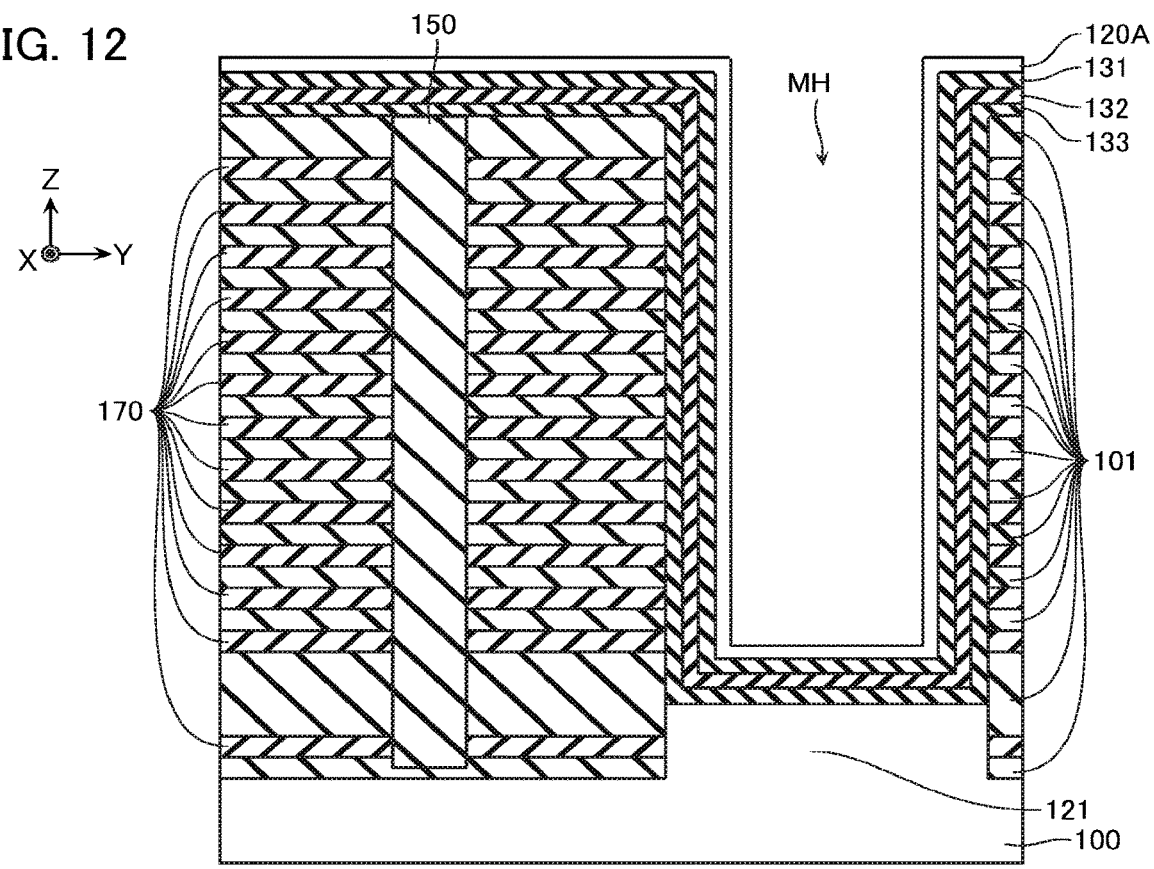
FIG. 12 is a schematic cross-sectional view illustrating the manufacturing method.

Next, as illustrated in FIG. 12, the block insulating layer 133, the charge storage layer 132, the tunnel insulating layer 131, and an amorphous silicon film 120A are deposited on the bottom surface and the side surface of the memory hole MH. This process is performed by a method such as CVD.

Figure 13:
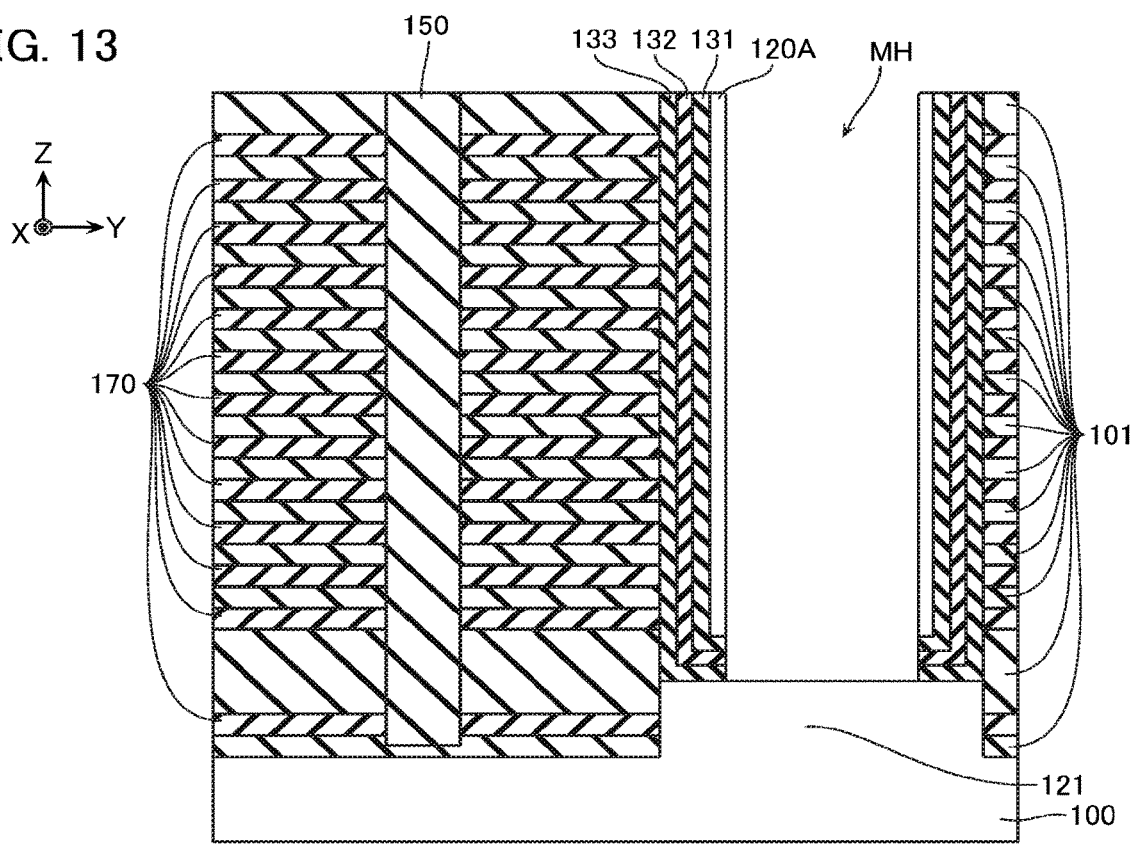
FIG. 13 is a schematic cross-sectional view illustrating the manufacturing method.

Next, as illustrated in FIG. 13, a part of the deposited films (133, 132, 131, 120A) is removed to expose the top surface of the semiconductor layer 121 and the top surface of the insulating layer 101. This process is performed by for example, RIE.

Figure 14:
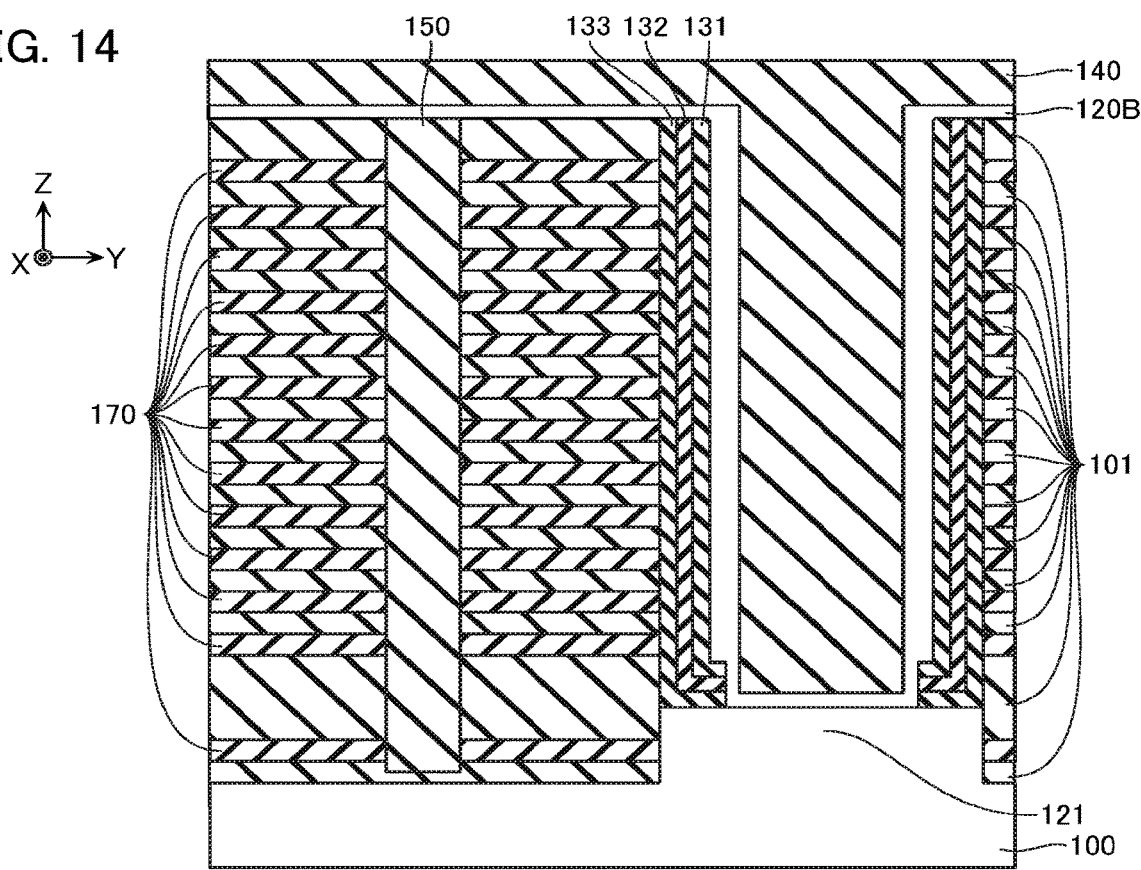
FIG. 14 is a schematic cross-sectional view illustrating the manufacturing method.

Next, as illustrated in FIG. 14, an amorphous silicon film and the insulating layer 140 are deposited inside the memory hole MH. A crystalline structure of the amorphous silicon film is reformed by performing a heat treatment or the like to form a semiconductor layer 120B of polycrystalline silicon (Si) or the like.

Figure 15:
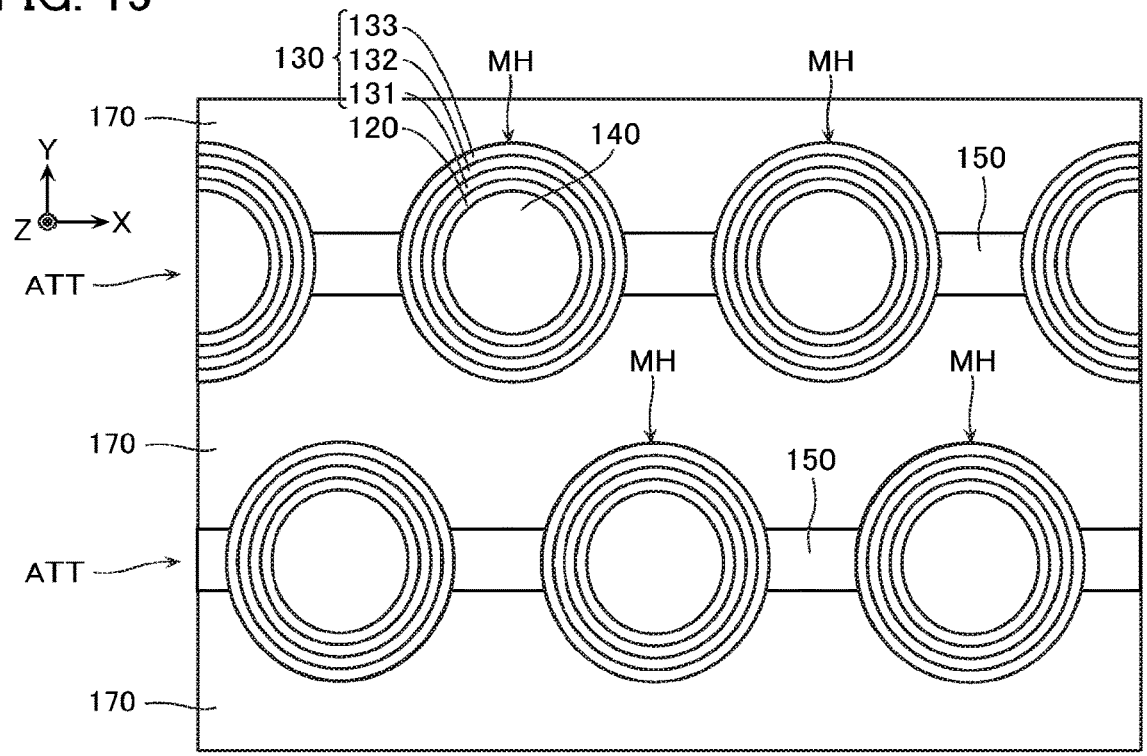
FIG. 15 is a schematic plan view illustrating the manufacturing method.
Figure 16:
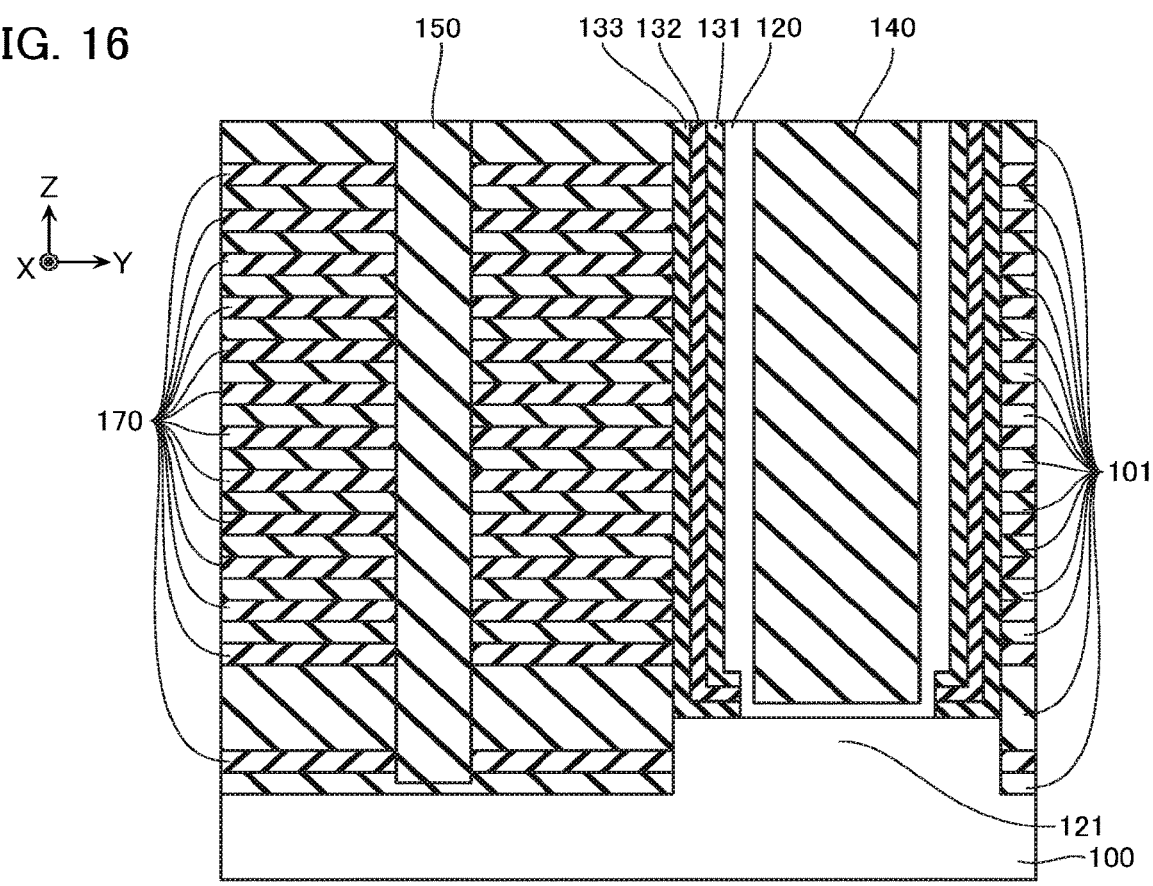
FIG. 16 is a schematic cross-sectional view illustrating the manufacturing method.

Next, as illustrated in FIG. 15 and FIG. 16, upper portions of the insulating layer 140 and the semiconductor layer 120B are removed to expose the top surface of the insulating layer 101 and separate the semiconductor layer 120B by each memory hole MH.

Figure 17:
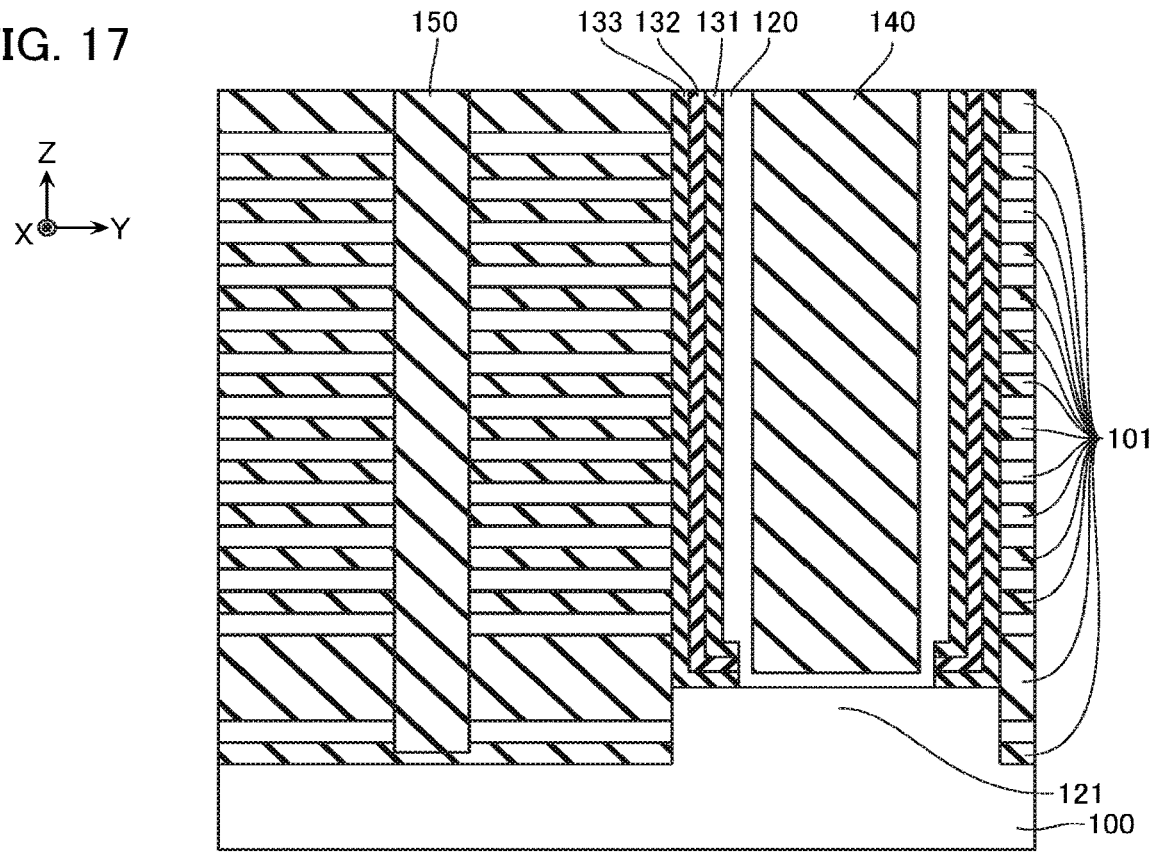
FIG. 17 is a schematic cross-sectional view illustrating the manufacturing method.

Next, as illustrated in FIG. 17, the sacrifice layers 170 are removed to expose the top surfaces and the lower surfaces of the insulating layers 101. In this process, for example, through-holes that passes through the plurality of insulating layers 101 and the sacrifice layers 170 is formed in the structure illustrated in FIG. 15 and FIG. 16. The sacrifice layers 170 are removed by a method such as wet etching via these through-holes.

Figure 18:
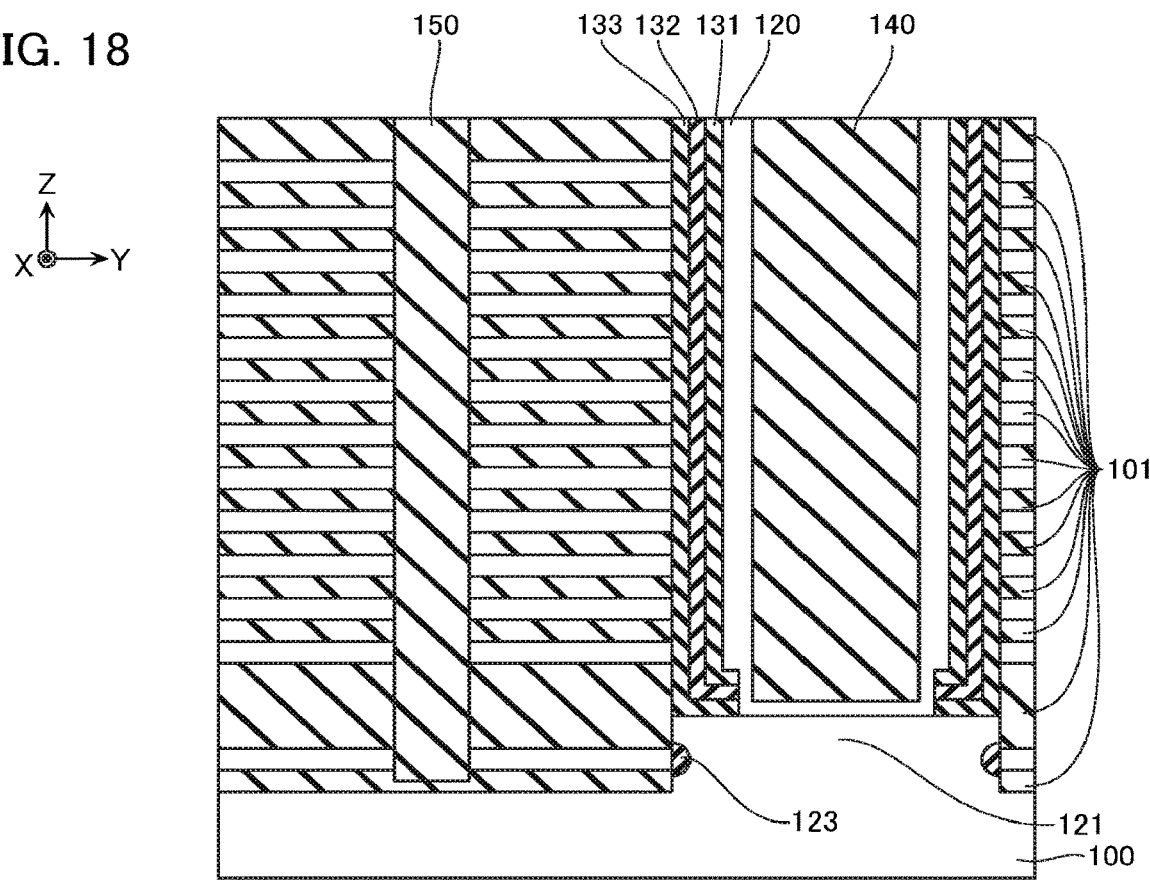
FIG. 18 is a schematic cross-sectional view illustrating the manufacturing method.

Next, as illustrated in FIG. 18, the insulating layer 123 is formed on the side surface of the semiconductor layer 121 by, for example, an oxidized treatment. The conductive layers 110 are formed on the top surfaces and the lower surfaces of the insulating layers 101 by a method such as CVD. This forms the structure as illustrated in FIG. 2 and FIG. 3.

[Read Operation]

Figure 19:
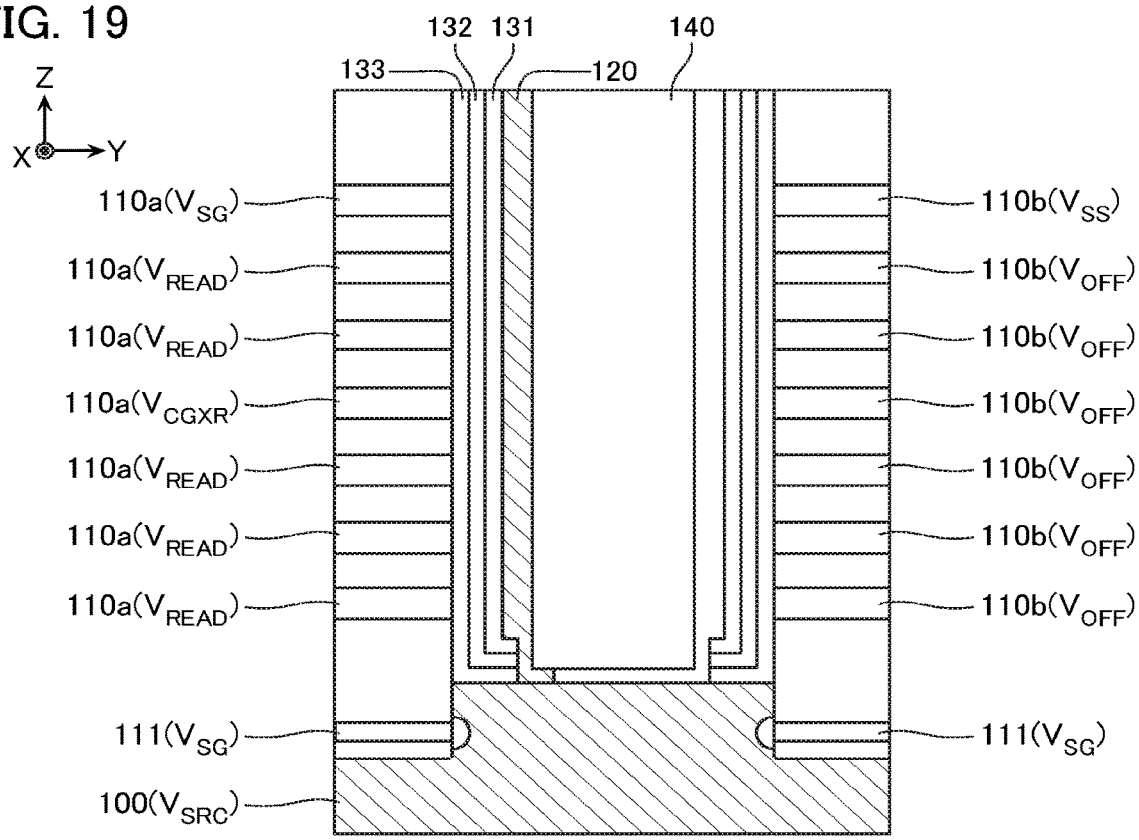
FIG. 19 is a schematic cross-sectional view for describing a read operation according to the first embodiment.

Next, with reference to FIG. 19, a read operation of the semiconductor memory device according to the embodiment will be described. FIG. 19 is a schematic cross-sectional view for describing the read operation. Note that, FIG. 19 describes an example of executing the read operation on a predetermined memory cell MC included in the memory string MSa.

As illustrated in FIG. 19, in the read operation, a read voltage $V_{CGXR}$ is supplied to the conductive layer 110a that functions as the selected word line WL, a read pass voltage $V_{READ}$ is supplied to the conductive layers 110a that function as the unselected word lines WL, a voltage $V_{SG}$ is supplied to the conductive layer 110a that functions as the drain side select gate line SGD, a read blocking voltage $V_{OFF}$ is supplied to the plurality of the conductive layers 110b that function as the word lines WL, a ground voltage $V_{SS}$ is supplied to the conductive layer 110b that functions as the drain side select gate line SGD, a voltage $V_{SG}$ is supplied to the conductive layer 111 that functions as the source side select gate line SGS, and a source voltage $V_{SRC}$ is supplied to the semiconductor substrate 100.

The read voltage $V_{CGXR}$ is a voltage having a magnitude for causing the memory cell MC to enter into the ON state or the OFF state corresponding to the data recorded in the memory cell MC. For example, when the threshold voltage of the memory cell MC is controlled into n (n is an integer of two or more) states, the read voltage $V_{CGXG}$ is controlled into at least n−1 magnitudes. The read pass voltage $V_{READ}$ is a voltage having a magnitude for causing the memory cell MC to enter into the ON state regardless of the data recorded in the memory cell MC and is larger than the maximum value of the read voltage $V_{CGXG}$. The read blocking voltage $V_{OFF}$ is a voltage having a magnitude for causing the memory cell MC to enter into the OFF state regardless of the data recorded in the memory cell MC and is smaller than the minimum value of the read voltage $V_{CGXR}$. The read blocking voltage $V_{OFF}$ may be, for example, smaller than the ground voltage $V_{SS}$. That is, the read blocking voltage $V_{OFF}$ may have negative polarity. The voltage $V_{SG}$ is a voltage having a magnitude for causing the drain side select transistor STD and the source side select transistor STS to enter into the ON state and is larger than the ground voltage $V_{SS}$. The source voltage $V_{SRC}$ is a voltage having a magnitude approximately the same as the ground voltage $V_{SS}$ and is larger than the ground voltage $V_{SS}$.

This forms a channel of electrons that electrically conducts the bit line BL with the channel region of the selected memory cell MC and a channel of electrons that electrically conducts the source line SL with the channel region of the selected memory cell MC in the semiconductor layer 120. The selected memory cell MC is caused to be in the ON state or OFF state corresponding to an electric charge amount accumulated in the charge storage layer 132 of the selected memory cell MC. The control circuit CC (FIG. 1) determines the data recorded in the memory cell MC by, for example, detecting the magnitude of the voltage of the bit line BL or the magnitude of the current flowing in the bit line BL.

Note that, in FIG. 19, the read blocking voltage $V_{OFF}$ is supplied to all the conductive layers 110b that function as the word lines WL. However, such a method is merely an example, and the specific method is appropriately adjustable. For example, the read blocking voltage $V_{OFF}$ may be supplied only to the conductive layer 110b adjacent in the Y-direction to the conductive layer 110a that functions as the selected word line WL, and the ground voltage $V_{SS}$, the read pass voltage $V_{READ}$, or another voltage may be supplied to the other conductive layers 110b that function as the word lines WL.

[Write Operation]

Figure 20:
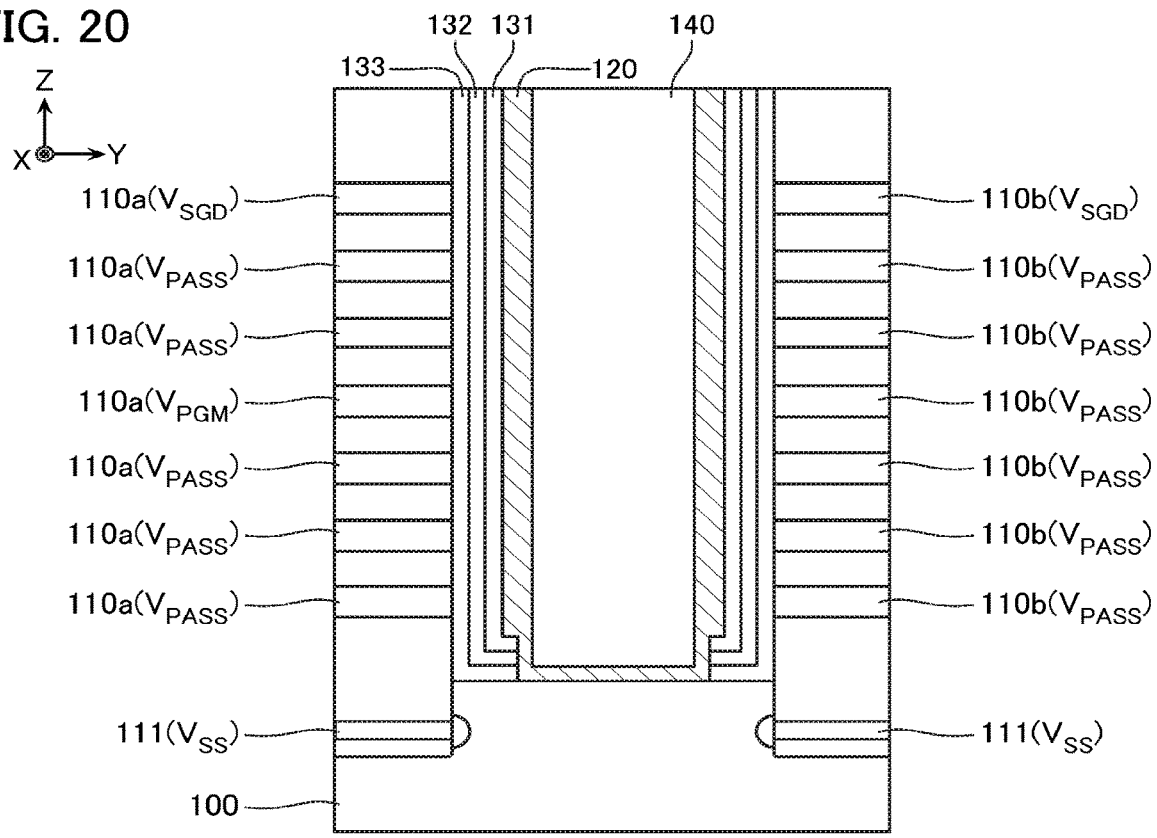
FIG. 20 is a schematic cross-sectional view for describing a write operation according to the first embodiment.

Next, with reference to FIG. 20, a write operation of the semiconductor memory device according to the embodiment will be described. FIG. 20 is a schematic cross-sectional view for describing the write operation. Note that, FIG. 20 describes an example of executing a write operation on a predetermined memory cell MC included in the memory string MSa.

As illustrated in FIG. 20, in the write operation, a program voltage $V_{PGM}$ is supplied to the conductive layer 110a that functions as the selected word line WL, a write pass voltage $V_{PASS}$ is supplied to the conductive layers 110a, 110b that function as the unselected word lines WL, a voltage $V_{SGD}$ is supplied to the conductive layers 110a, 110b that function as the drain side select gate line SGD, and the ground voltage $V_{SS}$ is supplied to the conductive layer 111 that functions as the source side select gate line SGS.

The program voltage $V_{PGM}$ is a voltage having a magnitude for causing electrons to accumulate in the charge storage layer 132 of the selected memory cell MC, and is larger than the above-described read pass voltage $V_{READ}$. The write pass voltage $V_{PASS}$ is a voltage having a magnitude for causing the memory cell MC to enter into the ON state regardless of the data recorded in the memory cell MC, and is the same as or larger than the above-described read pass voltage $V_{READ}$ and is smaller than the program voltage $V_{PGM}$. The voltage $V_{SGD}$ is a voltage having a magnitude for causing the drain side select transistor STD to enter into the ON state when the source voltage $V_{SRC}$ is supplied to the bit line BL and for causing the drain side select transistor STD to enter into the OFF state when a predetermined driving voltage is supplied to the bit line BL. The voltage $V_{SGD}$ is larger than the ground voltage $V_{SS}$ and is smaller than the above-described voltage $V_{SG}$.

This forms a channel of electrons that electrically conducts the bit line BL with the channel region of the selected memory cell MC in the semiconductor layer 120. The electrons in the channel region of the selected memory cell MC tunnels through the first region 131a of the tunnel insulating layer 131 to be accumulated in the first region 132a of the charge storage layer 132.

[Erase Operation]

Figure 21:
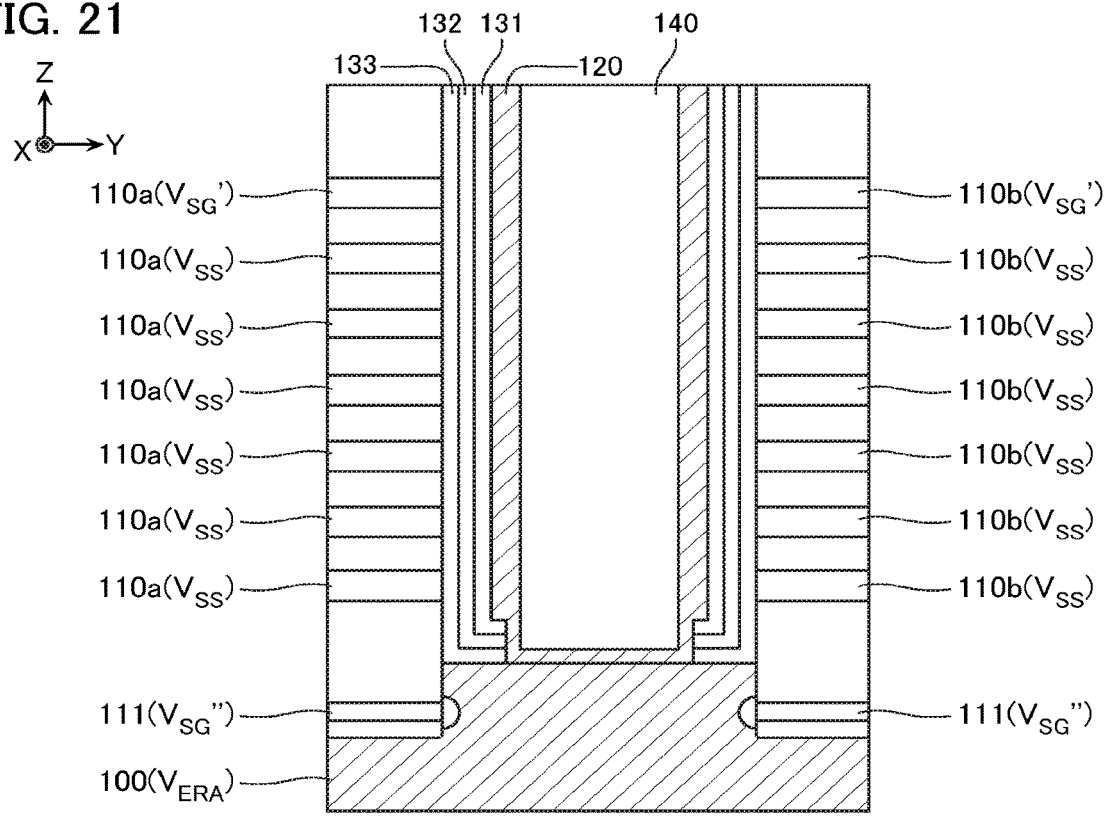
FIG. 21 is a schematic cross-sectional view for describing an erase operation according to the first embodiment.

Next, with reference to FIG. 21, an erase operation of the semiconductor memory device according to the embodiment will be described. FIG. 21 is a schematic cross-sectional view for describing the erase operation. Note that FIG. 21 describes an example of executing the erase operation on the plurality of memory cells MC included in the memory strings MSa, MSb.

As illustrated in FIG. 21, in the erase operation, the ground voltage $V_{SS}$ is supplied to the conductive layers 110a, 110b that function as the word lines WL, a voltage $V_{SG}'$ is supplied to the conductive layers 110a, 110b that function as the drain side select gate line SGD, a voltage $V_{SG}''$ is supplied to the conductive layer 111 that functions as the source side select gate line SGS, and an erase voltage $V_{ERA}$ is supplied to the semiconductor substrate 100.

The voltage $V_{SG}'$ may be, for example, a voltage having a magnitude for causing the drain side select transistor STD to enter into the OFF state. The voltage $V_{SG}''$ is a voltage having a magnitude for causing the source side select transistor STS to enter into the ON state. However, the voltage $V_{SG}''$ is a voltage having a magnitude for forming a channel of holes, not a channel of electrons, in the channel region of the source side select transistor STS, and is smaller than the erase voltage $V_{ERA}$. The erase voltage $V_{ERA}$ is a voltage having a magnitude for injecting the holes in the charge storage layer 132 of the selected memory cell MC, and may be a voltage having a magnitude approximately the same as the above-described program voltage $V_{PGM}$ or may be a voltage having a magnitude larger than the above-described program voltage $V_{PGM}$.

This forms the channel of holes that electrically conducts all the channel regions of the memory cells MC with the source line SL in the semiconductor layer 120. The holes tunnel through the tunnel insulating layer 131 from the channel region of the selected memory cell MC to cancel the electrons accumulated in the charge storage layer 132.

[Write Characteristic]

By executing the above-described write operation for multiple times on the semiconductor memory device as describe with reference to FIG. 2 and FIG. 3, the electric charge is gradually accumulated in the charge storage layer 132 to gradually increase the threshold voltage of the memory cell MC. In this embodiment, the threshold voltage of the memory cell MC is controlled into two or more states with such a method, and the data is stored by this.

Figure 22:
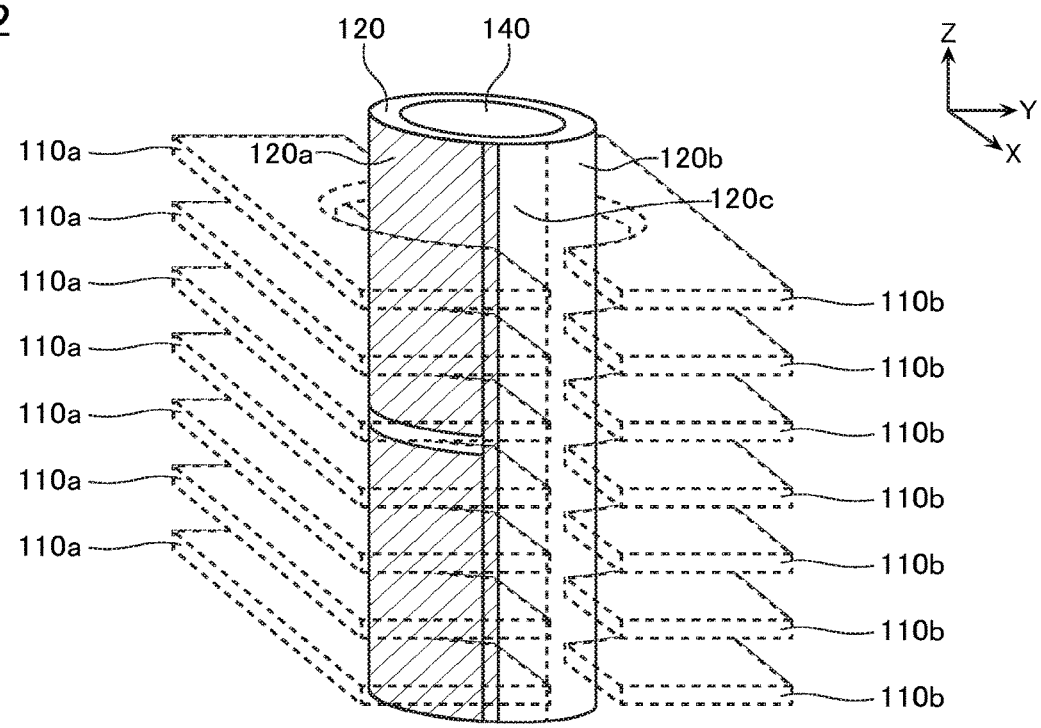
FIG. 22 is a schematic perspective view for describing a leak current of a memory cell MC.

However, in the semiconductor memory device described with reference to FIG. 2 and FIG. 3, there is a case where the threshold voltage of the memory cell MC is not preferably increased by the write operation described above. This is considered to be caused by the following phenomenon. That is, the above-described read operation is executed after executing the write operation, and when the current flows in the bit line BL, it is determined that the threshold voltage of the memory cell MC has not reached the target value. When the current does not flow in the bit line BL, it is determined that the threshold voltage of the memory cell MC has reached the target value. When the write operation is executed in the semiconductor memory device described with reference to FIG. 2 and FIG. 3, there is a case where electrons of sufficient electric charge amount are not accumulated in the third region 132c of the charge storage layer 132. In view of this, when the read operation is executed after executing the write operation, for example, as illustrated in FIG. 22, there is a case where a channel of electrons is formed at a boundary between the first region 120a and the third region 120c of the semiconductor layer 120, and this serves as a leakage path to cause the current to flow. In such a case, even when electrons of sufficient electric charge amount are accumulated in the first region 132a of the charge storage layer 132 of the selected memory cell MC in the write operation, there is a case where the threshold voltage of the memory cell MC does not reach the target value.

Figure 23:
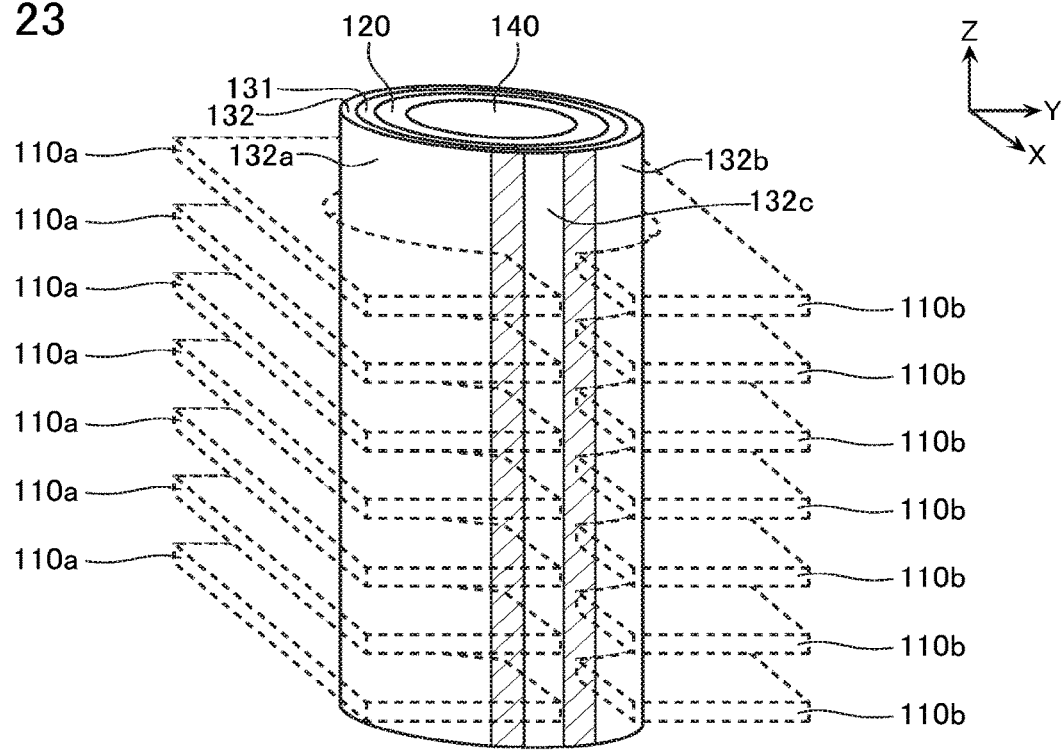
FIG. 23 is a schematic perspective view for describing a method for reducing the leak current of the memory cell MC.

Therefore, in this embodiment, for example, as illustrated in FIG. 23, before executing the above-described write operation, electrons are preliminarily accumulated in a region at the boundary between the first region 132a and the third region 132c of the charge storage layer 132. Similarly, electrons are preliminarily accumulated in a region at a boundary between the second region 132b and the third region 132c of the charge storage layer 132. This ensures reducing the formation of the leakage path at the above-described boundaries of the semiconductor layer 120 in the read operation and preferably controlling the threshold voltage of the memory cell MC. Note that, in the following description, such regions at the boundaries may be referred to as a "boundary region (132a to 132c)" and a "boundary region (132b to 132c)."

The following exemplarily illustrates two methods for accumulating electric charge in the boundary regions (132a to 132c), (132b to 132c) of the charge storage layer 132.

[Flash Write Operation]

Figure 24:
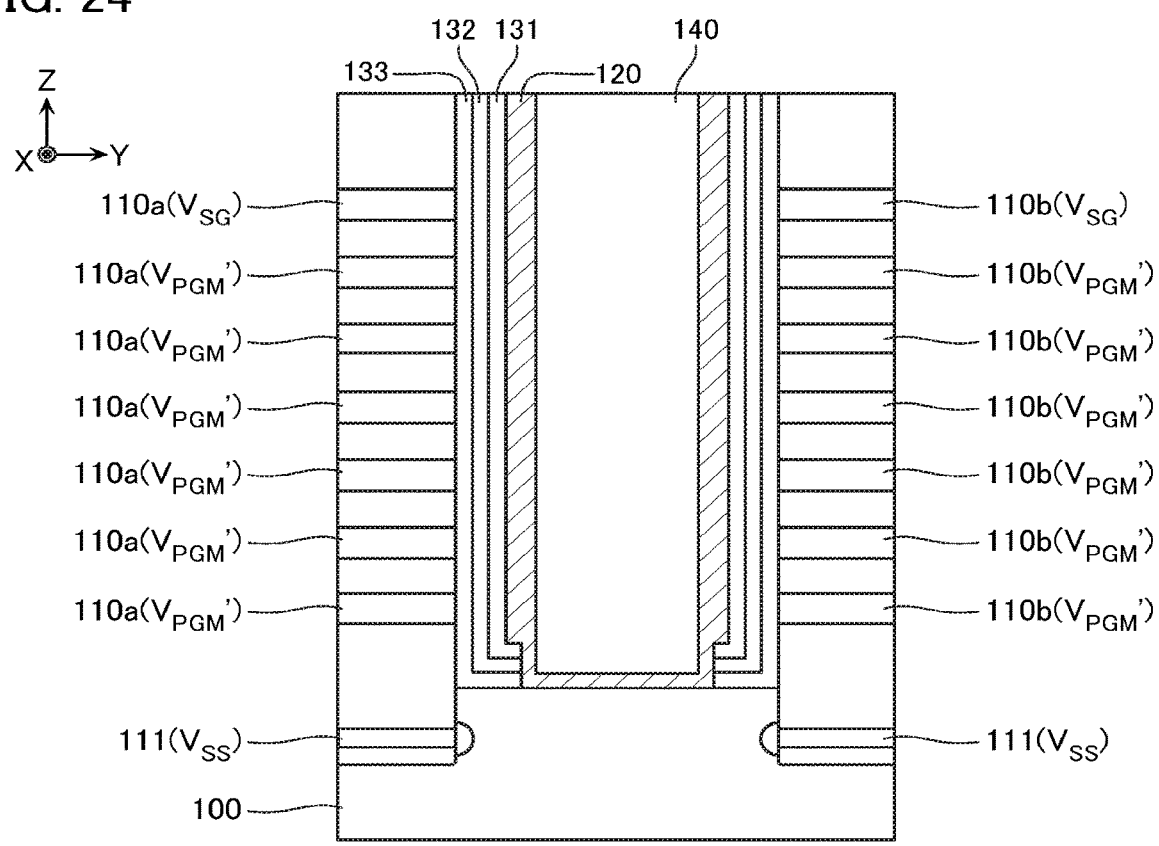
FIG. 24 is a schematic cross-sectional view for describing a flash write operation according to the first embodiment.

First, with reference to FIG. 24, a flash write operation of the semiconductor memory device according to the embodiment will be described. FIG. 24 is a schematic cross-sectional view for describing the flash write operation. Note that, FIG. 24 describes an example of executing the flash write operation on all the memory cells MC included in the memory strings MSa, MSb.

As illustrated in FIG. 24, in the flash write operation, a program voltage $V_{PGM}'$ is supplied to the conductive layers 110a, 110b that function as the word lines WL, the voltage $V_{SG}$ is supplied to the conductive layers 110a, 110b that function as the drain side select gate line SGD, and the ground voltage $V_{SS}$ is supplied to the conductive layer 111 that functions as the source side select gate line SGS.

Note that the program voltage $V_{PGM}'$ may be a voltage having a magnitude approximately the same as the program voltage $V_{PGM}$ described with reference to FIG. 20 or the erase voltage $V_{ERA}$ described with reference to FIG. 21, or may be a voltage larger than the program voltage $V_{PGM}$ and the erase voltage $V_{ERA}$. A period during which the program voltage $V_{PGM}'$ is supplied to the conductive layers 110a, 110b in the flash write operation may be a period approximately the same as a period during which the program voltage $V_{PGM}$ is supplied to the conductive layers 110a, 110b in the write operation described with reference to FIG. 20 or a period during which the erase voltage $V_{ERA}$ is supplied to the conductive layers 110a, 110b in the erase operation described with reference to FIG. 21, or may be a period longer than these periods. In the flash write operation, the voltage $V_{SG}$ may be supplied to the conductive layer 111 and the source voltage $V_{SRC}$ may be supplied to the semiconductor substrate 100.

This forms channels of electrons that electrically conduct the bit line BL and the channel regions of the memory cells MC in the semiconductor layer 120. The electrons in the channel regions of all the memory cells MC included in the memory strings MSa, MSb tunnel through the tunnel insulating layer 131 and are accumulated in the charge storage layer 132.

Figure 25:
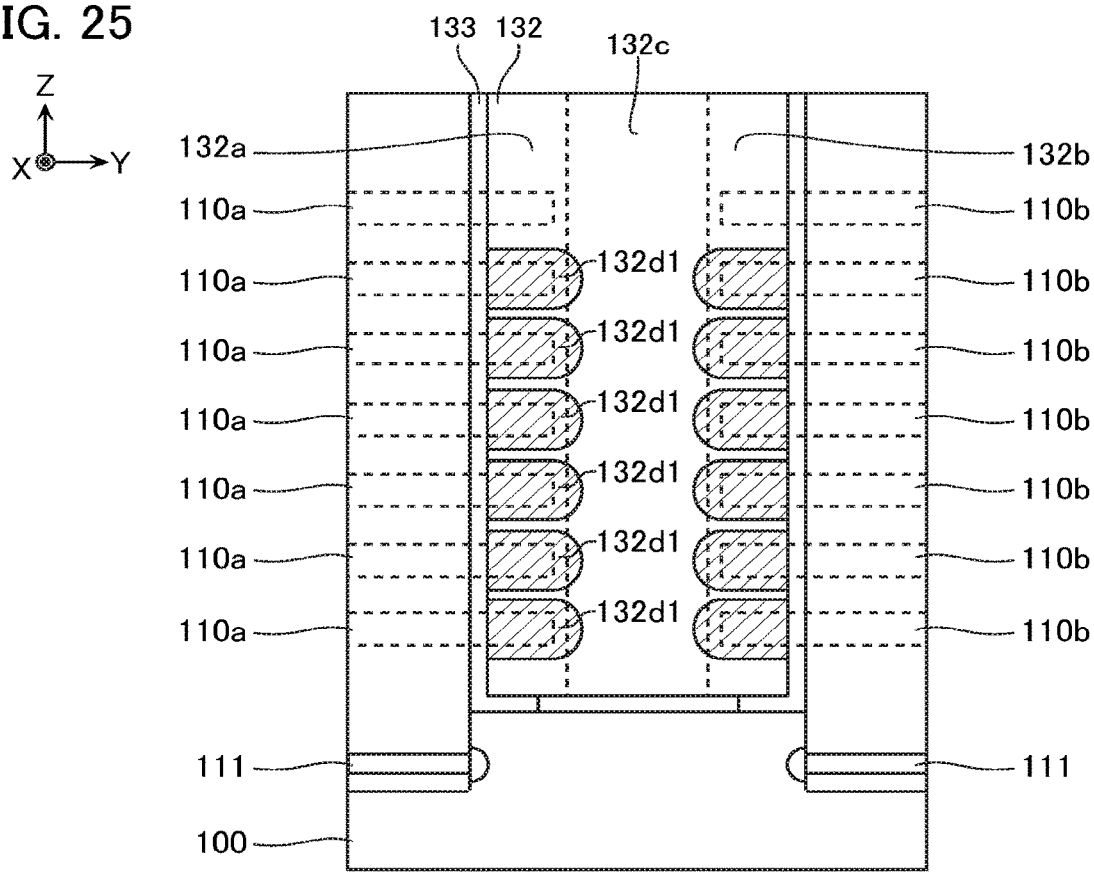
FIG. 25 is a schematic cross-sectional view for describing a method for reducing the leak current using the flash write operation.
Figure 26:
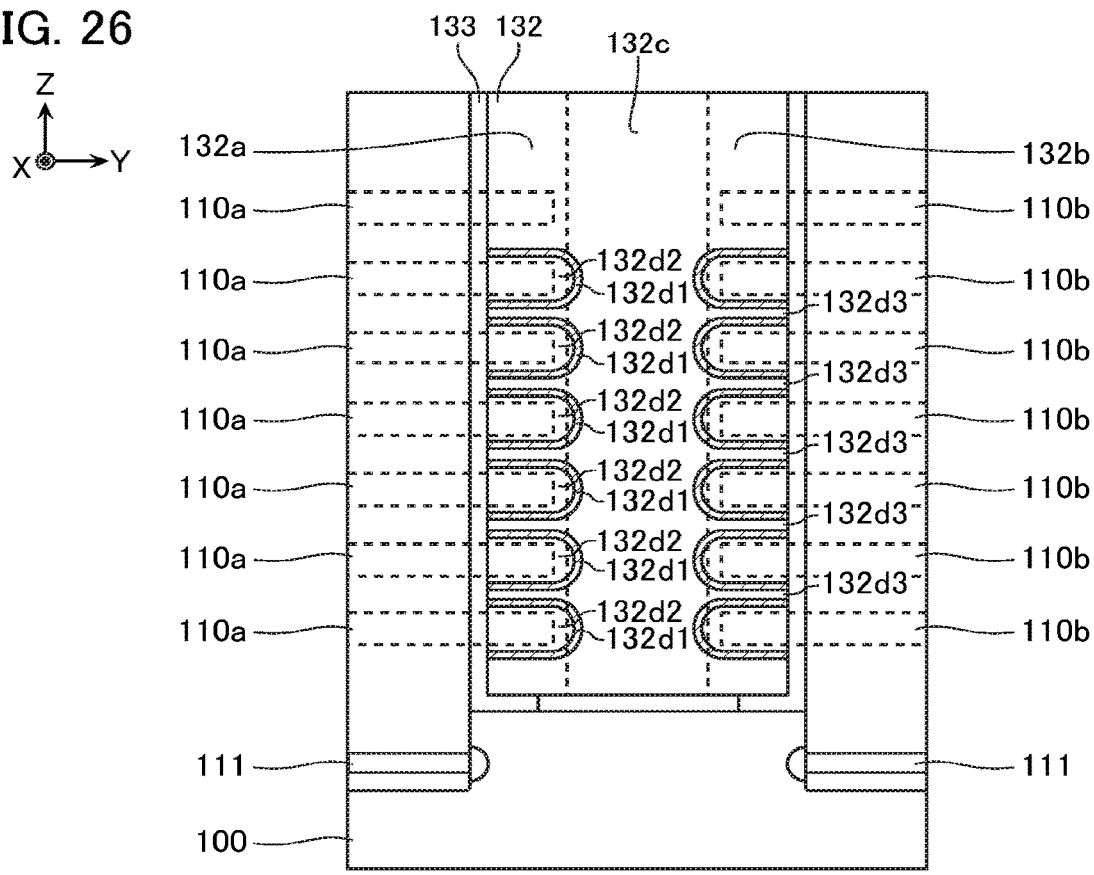
FIG. 26 is a schematic cross-sectional view for describing a method for reducing the leak current using the flash write operation.

When the flash write operation is executed, for example, as illustrated in FIG. 25, the electrons are accumulated in a region 132d1 in a range of a predetermined distance from the conductive layers 110a, 110b in the charge storage layer 132. When the erase operation is executed after executing the flash write operation, for example, as illustrated in FIG. 26, the electrons in a region 132d2 in a range of a predetermined distance from the conductive layers 110a, 110b in the charge storage layer 132 are cancelled and the holes are accumulated. Here, in the example in FIG. 26, the region 132d2 is narrower than the region 132d1. This causes the electrons to be accumulated in the boundary regions (132a to 132c), (132b to 132c) of the charge storage layer 132. Note that, in such a method, there is a case where the electrons are accumulated in a region 132d3 between the two conductive layers 110a, 110b adjacent in the Z-direction.

[Stripe Write Operation]

Figure 27:
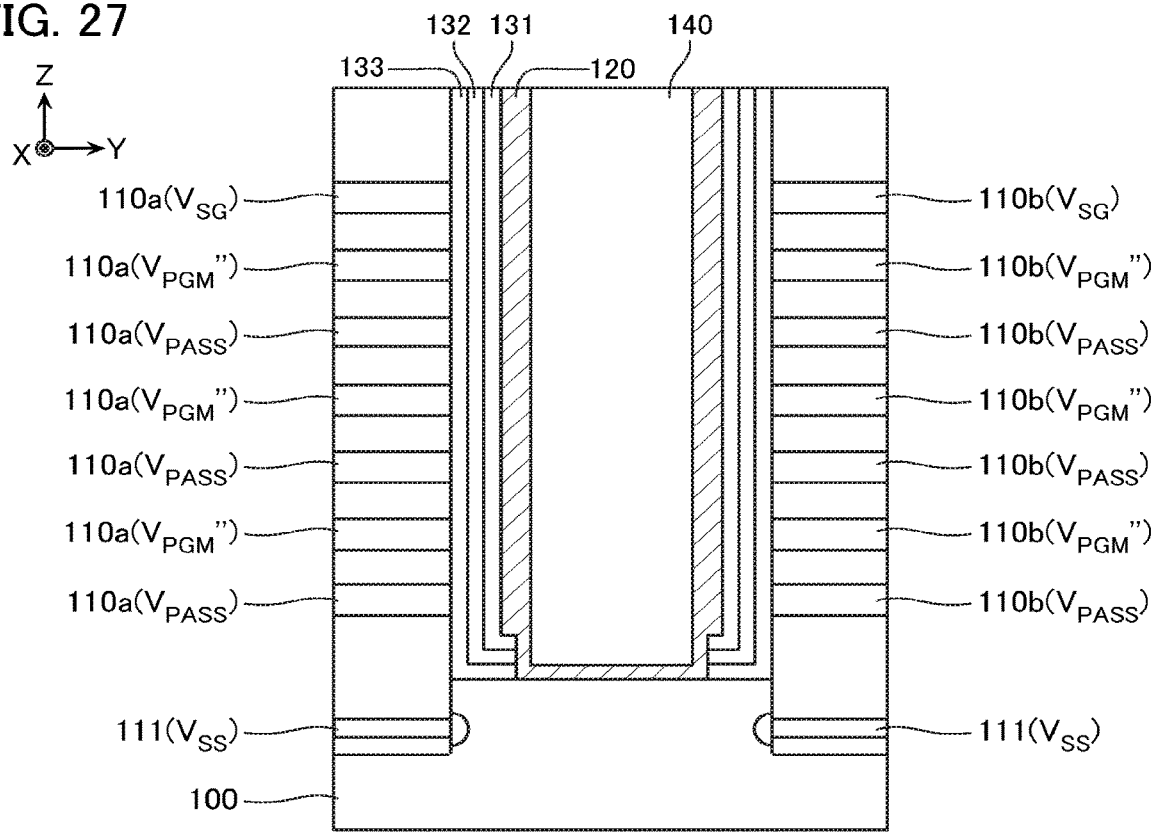
FIG. 27 is a schematic cross-sectional view for describing a stripe write operation according to the first embodiment.

Next, with reference to FIG. 27, a stripe write operation of the semiconductor memory device according to the embodiment will be described. FIG. 27 is a schematic cross-sectional view for describing the stripe write operation. Note that, FIG. 27 describes an example of executing the stripe write operation on the plurality of memory cells MC included in the memory strings MSa, MSb.

As illustrated in FIG. 27, in the stripe write operation, for example, among the conductive layers 110a, 110b that function as the word lines WL, even-numbered or odd-numbered conductive layers 110a, 110b counted from the lower side are supplied with the program voltage $V_{PGM}''$, odd-numbered or even-numbered conductive layers 110a, 110b counted from the lower side are supplied with the write pass voltage $V_{PASS}$, the conductive layers 110a, 110b that function as the drain side select gate line SGD are supplied with the voltage $V_{SG}$, and the conductive layer 111 that functions as the source side select gate line SGS is supplied with the ground voltage $V_{SS}$.

Note that, the program voltage $V_{PGM}''$ may be a voltage having a magnitude approximately the same as the program voltage $V_{PGM}$ described with reference to FIG. 20 or the erase voltage $V_{ERA}$ described with reference to FIG. 21 or may be a voltage larger than the program voltage $V_{PGM}$ and the erase voltage $V_{ERA}$. A period during which the program voltage $V_{PGM}''$ is supplied to the conductive layers 110a, 110b in the stripe write operation may be a period approximately the same as a period during which the program voltage $V_{PGM}$ is supplied to the conductive layers 110a, 110b in the write operation described with reference to FIG. 20 or a period during which the erase voltage $V_{ERA}$ is supplied to the conductive layers 110a, 110b in the erase operation described with reference to FIG. 21, or may be a period longer than these periods. In the stripe write operation, the voltage $V_{SG}$ may be supplied to the conductive layer 111 and the source voltage $V_{SRC}$ may be supplied to the semiconductor substrate 100.

This forms channels of electrons that electrically conduct the bit line BL with the channel regions of the memory cells MC in the semiconductor layer 120. The electrons in the channel regions of the even-numbered or odd-numbered memory cells MC counted from the lower side tunnel through the tunnel insulating layer 131 to be accumulated in the charge storage layer 132.

Figure 28:
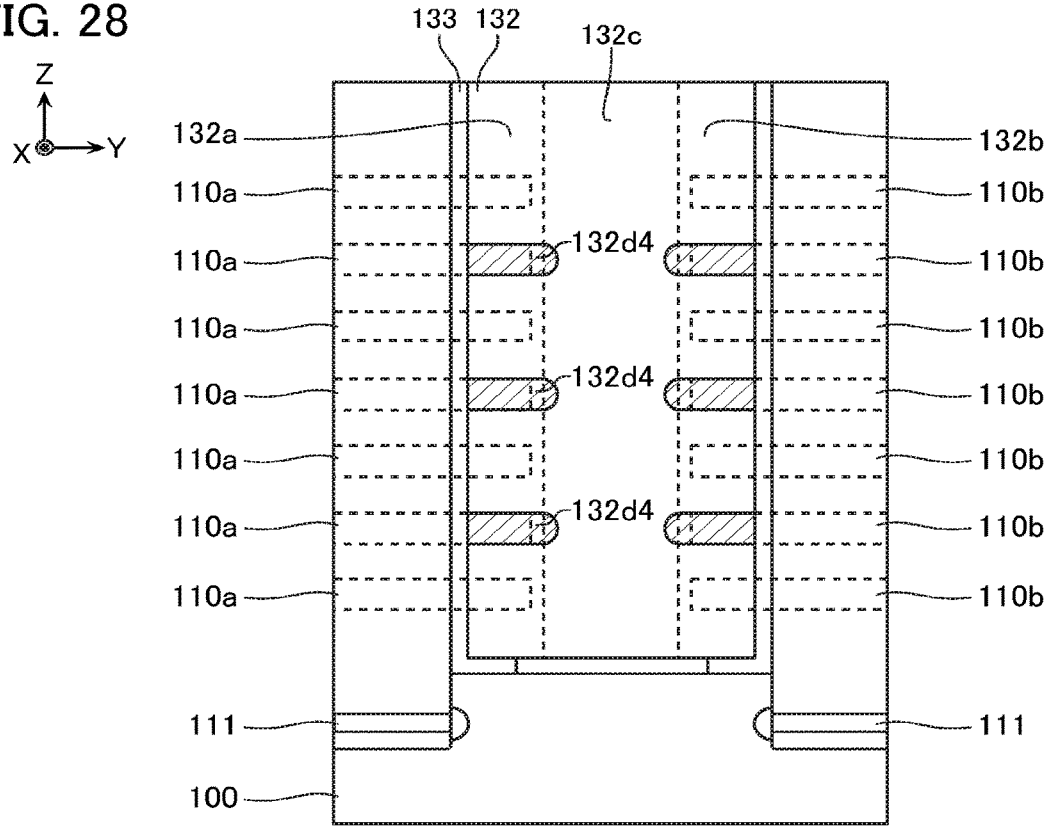
FIG. 28 is a schematic cross-sectional view for describing a method for reducing the leak current using the stripe write operation.
Figure 29:
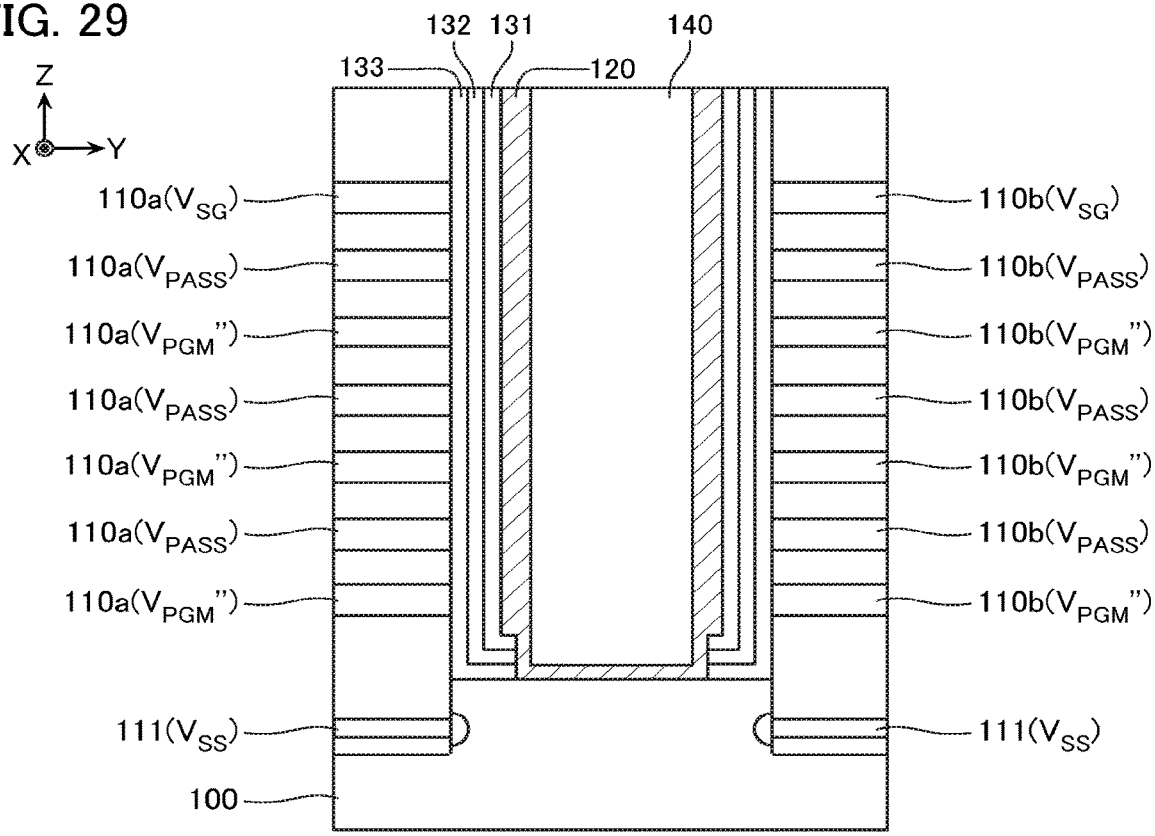
FIG. 29 is a schematic cross-sectional view for describing the stripe write operation according to the first embodiment.
Figure 30:
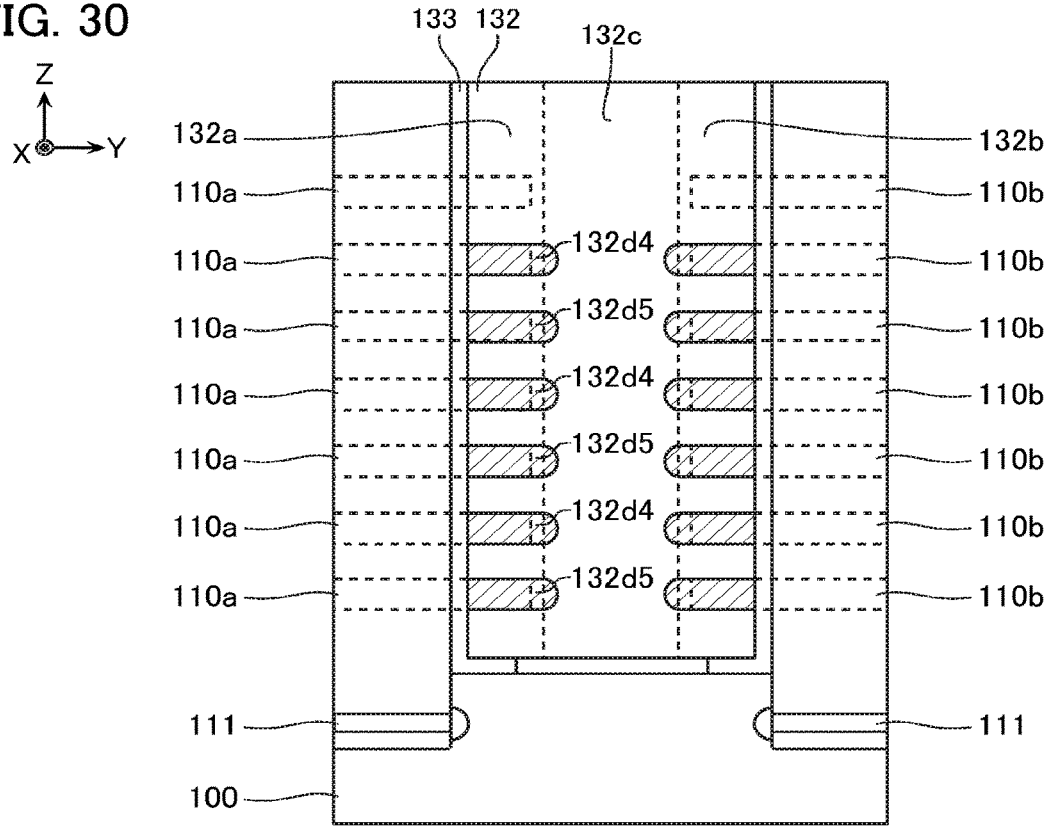
FIG. 30 is a schematic cross-sectional view for describing a method for reducing the leak current using the stripe write operation.
Figure 31:
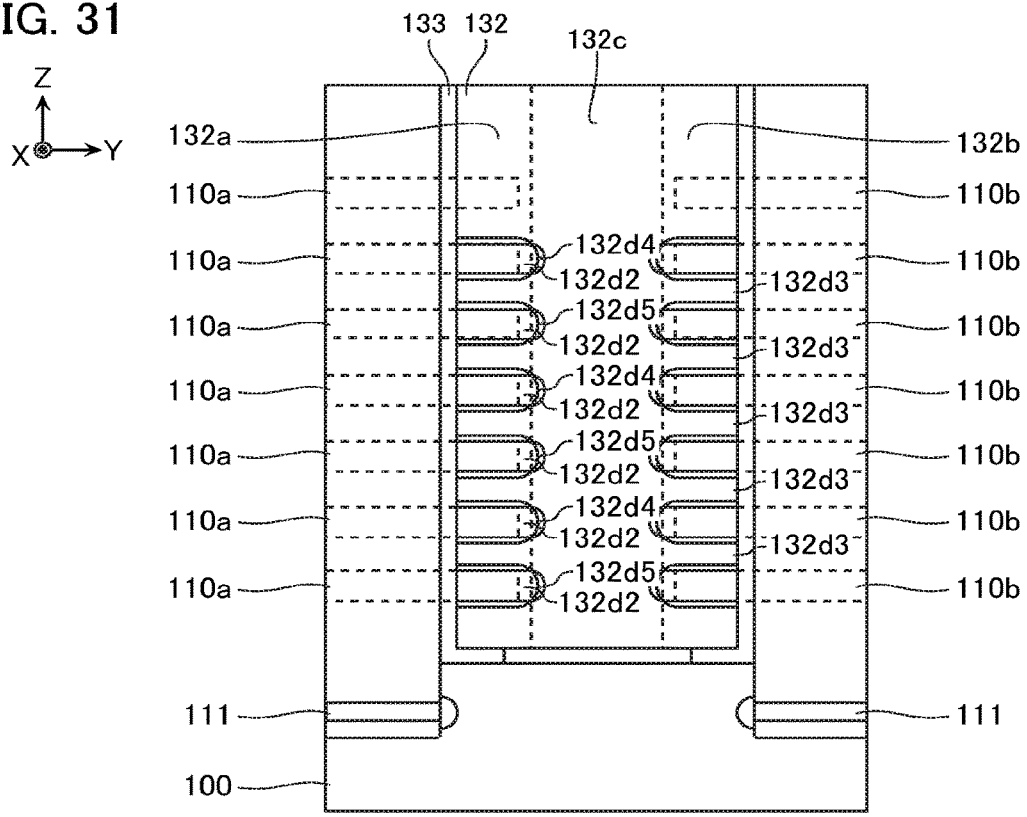
FIG. 31 is a schematic cross-sectional view for describing a method for reducing the leak current using the stripe write operation.

For example, as illustrated in FIG. 27, when the stripe write operation is executed on the even-numbered memory cells MC counted from the lower side, for example, as illustrated in FIG. 28, the electrons are accumulated in a region 132d4 including a part positioned at the proximity of the even-numbered conductive layers 110a, 110b counted from the lower side and a part positioned between one of these conductive layers 110a and one of these conductive layers 110b in the charge storage layer 132. After executing this stripe write operation, for example, as illustrated in FIG. 29, when the stripe write operation is executed on the odd-numbered memory cells MC counted from the lower side, for example, as illustrated in FIG. 30, the electrons are accumulated in a region 132d5 including a part positioned at the proximity of the odd-numbered conductive layers 110a, 110b counted from the lower side and a part positioned between one of these conductive layers 110a and one of these conductive layers 110b in the charge storage layer 132. When the erase operation is executed after executing this stripe write operation, for example, as illustrated in FIG. 31, the electrons in the region 132d2 in the range of the predetermined distance from the conductive layers 110a, 110b in the charge storage layer 132 are cancelled and the holes are accumulated. This causes the electrons to be accumulated in the boundary regions (132a to 132c), (132b to 132c) of the charge storage layer 132. Note that, such a method accumulates the holes in the above-described region 132d3 in some cases.

[Read Out Characteristic]

Figure 32:
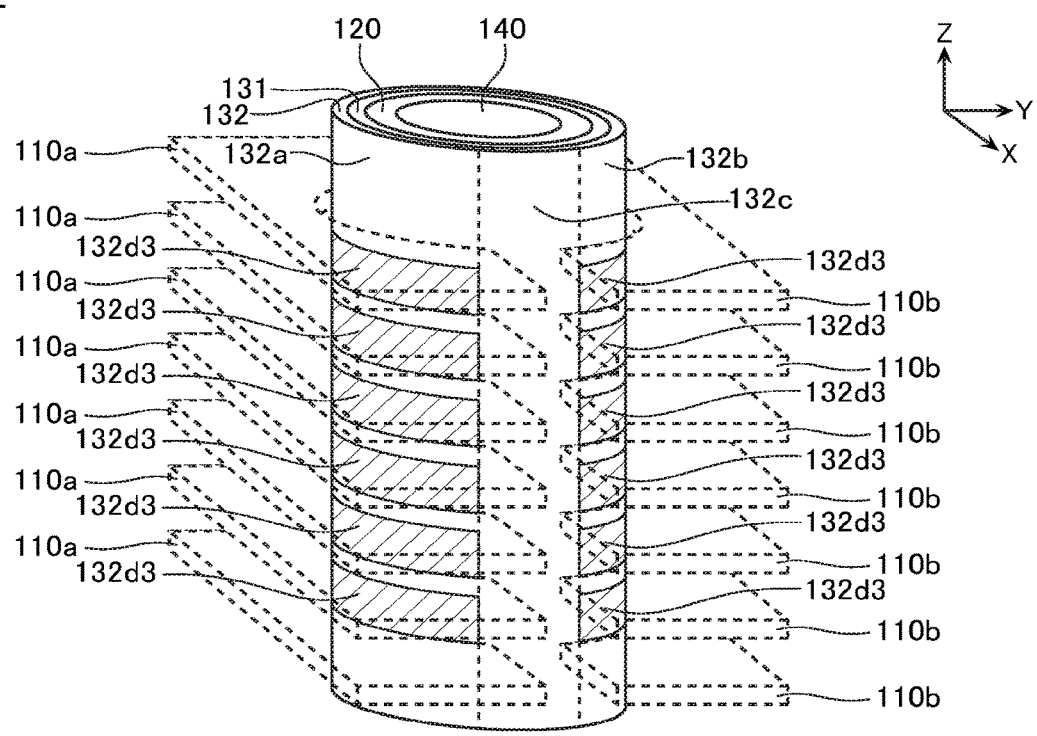
FIG. 32 is a schematic perspective view for describing an electric charge that may be accumulated in a region $132d3$ of a charge storage layer 132.

With the above-described flash write operation or stripe write operation, the electrons can be accumulated in the boundary regions (132a to 132c), (132b to 132c) of the charge storage layer 132. However, as described above, there is a case where the electrons are accumulated in the region 132d3 (FIG. 32) between the two conductive layers 110a and 110b adjacent in the Z-direction or the holes are accumulated in this region 132d3. When the electric charge amount in this region 132d3 is not appropriate, the data recorded in the memory cell MC may become difficult to be preferably read out.

Figure 33:
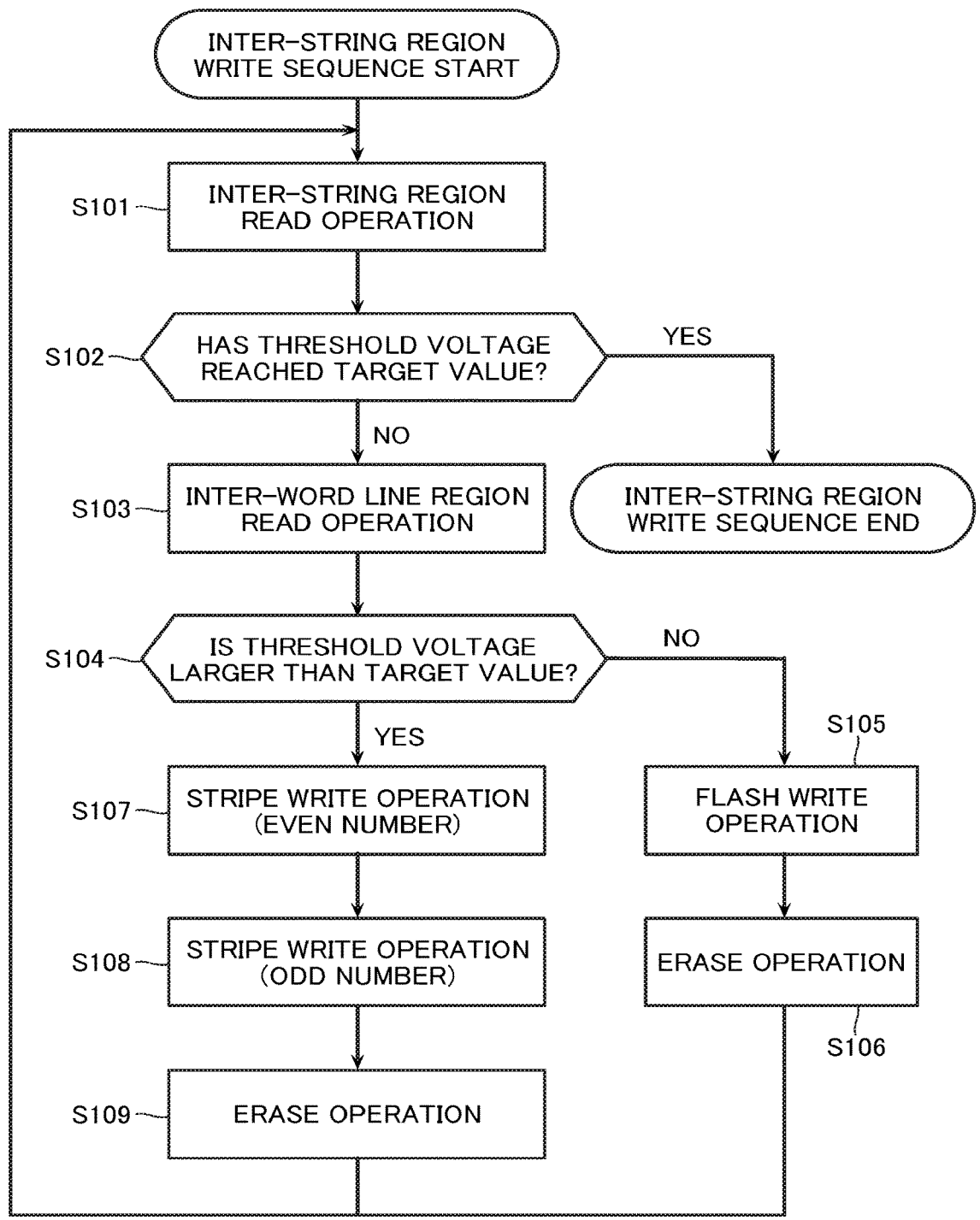
FIG. 33 is a schematic flowchart for describing an inter-string region write sequence according to the first embodiment.

Therefore, in this embodiment, for example, as illustrated in FIG. 33, it is configured that, while controlling the electric charge amount in the region 132d3 (FIG. 32) of the charge storage layer 132 into an appropriate amount by combining the above-described flash write operation, stripe write operation, erase operation, and the like, an operation to cause the electrons to be accumulated in the boundary regions (132a to 132c), (132b to 132c) can be executed. Such an operation may be hereinafter referred to as an "inter-string region write sequence."

[Inter-String Region Write Sequence]

FIG. 33 is a schematic flowchart for describing an inter-string region write sequence.

Figure 34:
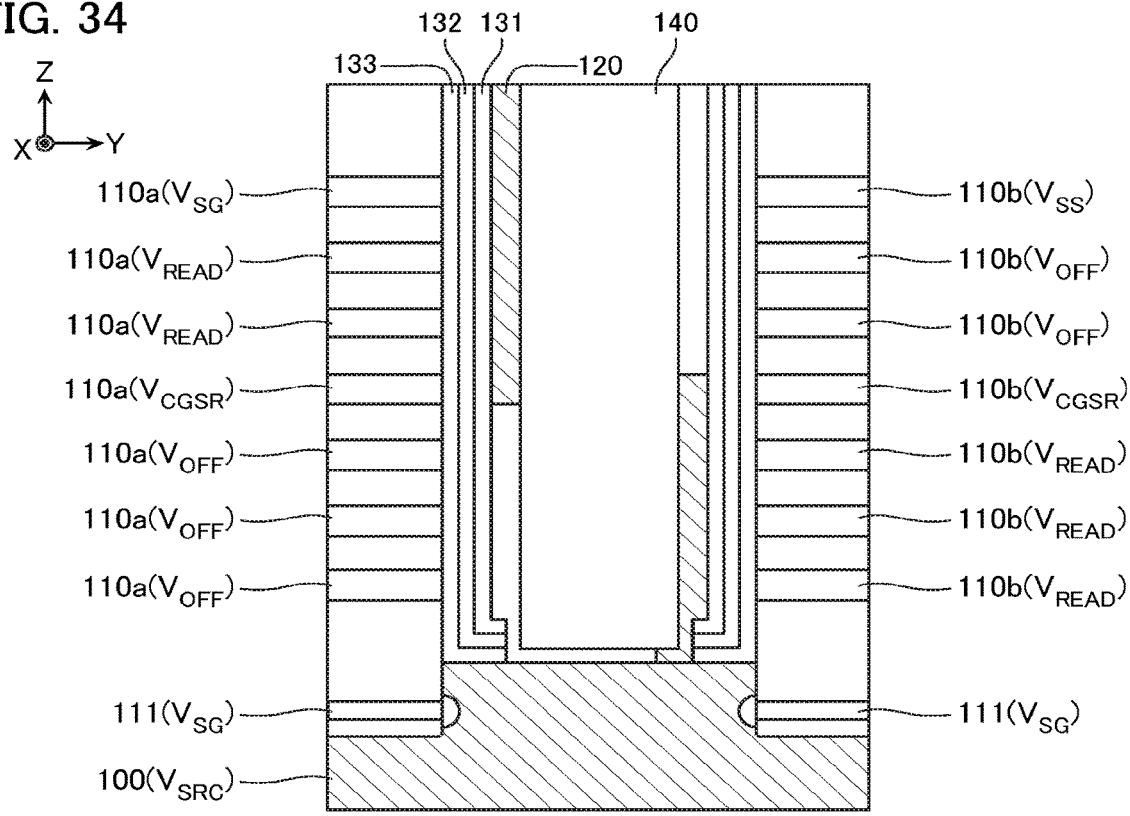
FIG. 34 is a schematic cross-sectional view for describing an inter-string region read operation according to the first embodiment.

At Step S101, an inter-string region read operation is executed. FIG. 34 is a schematic cross-sectional view for describing the inter-string region read operation.

As illustrated in FIG. 34, in the inter-string region read operation, an inter-string region read voltage $V_{CGSR}$ is supplied to a pair of the conductive layers 110a, 110b that function as the selected word line WL. The pair of conductive layers 110a, 110b are, for example, two conductive layers 110a, 110b disposed at a corresponding height position. In the inter-string region read operation, for example, among the plurality of the conductive layers 110a, the conductive layers 110a that function as the word lines WL positioned above the conductive layer 110a functioning as the selected word line WL are supplied with the read pass voltage $V_{READ}$, the conductive layers 110a that function as the word lines WL positioned below the conductive layer 110a functioning as the selected word line WL are supplied with the read blocking voltage $V_{OFF}$, and the conductive layer 110a that functions as the drain side select gate line SGD is supplied with the voltage $V_{SG}$. For example, among the plurality of the conductive layers 110b, the conductive layers 110b that function as the word lines WL positioned below the conductive layer 110b functioning as the selected word line WL are supplied with the read pass voltage $V_{READ}$, the conductive layers 110b that function as the word lines WL positioned above the conductive layer 110b functioning as the selected word line WL are supplied with the read blocking voltage $V_{OFF}$, and the conductive layer 110b that functions as the drain side select gate line SGD is supplied with the ground voltage $V_{SS}$. The conductive layer 111 that functions as the source side select gate line SGS is supplied with the voltage $V_{SG}$, and the semiconductor substrate 100 is supplied with the source voltage $V_{SRC}$.

The magnitude of the inter-string region read voltage $V_{CGSR}$ is appropriately adjustable. The inter-string region read voltage $V_{CGSR}$ may, for example, be larger than the maximum value of the above-described read voltage $V_{CGXR}$ (FIG. 19), and may be smaller than the above-described write pass voltage $V_{PASS}$ (FIG. 20). The inter-string region read voltage $V_{CGSR}$ may, for example, be a voltage having a magnitude approximately the same as the read pass voltage $V_{READ}$ (FIG. 19).

Figure 35:
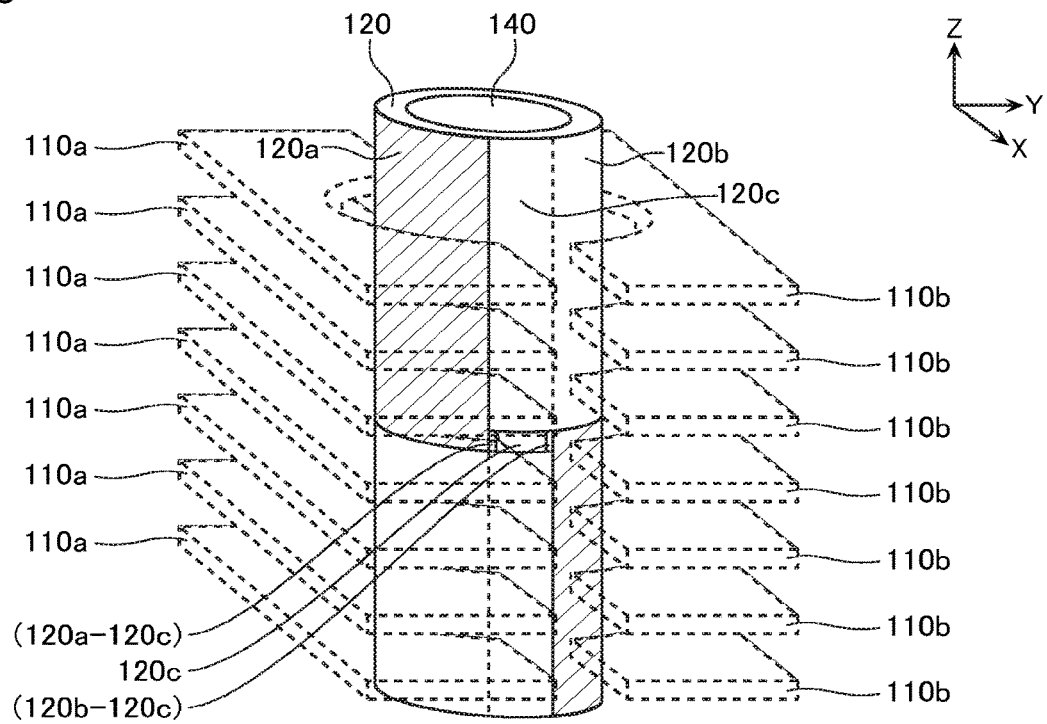
FIG. 35 is a schematic perspective view for describing the inter-string region read operation according to the first embodiment.

For example, as illustrated in FIG. 35, this forms a channel of electrons that electrically conducts the bit line BL with the channel region of the selected memory cell MC in the memory string MSa and a channel of electrons that electrically conducts the source line SL with the channel region of the selected memory cell MC in the memory string MSb in the semiconductor layer 120. Corresponding to the electric charge amount of the electrons accumulated at the boundary regions (132a to 132c), (132b to 132c) of the charge storage layer 132, channels of electrons are formed in regions (120a to 120c), (120b to 120c) on the outer peripheral surface of the semiconductor layer 120 opposed to these boundary regions (132a to 132c), (132b to 132c), and in the third region 120c. This electrically conducts or electrically separates the above-described two channels of electrons. The control circuit CC (FIG. 1), for example, determines whether the electric charge amount of the electrons accumulated at the boundary regions (132a to 132c), (132b to 132c) of the charge storage layer 132 has reached the target value or not by detecting the magnitude of the voltage of the bit line BL or the magnitude of the current flowing in the bit line BL.

Note that, in FIG. 34, the read blocking voltage $V_{OFF}$ is supplied to all the conductive layers 110a positioned below the conductive layer 110a functioning as the selected word line WL among the plurality of the conductive layers 110a functioning as the word lines WL. However, such a method is merely an example, and the specific method is appropriately adjustable. For example, only the conductive layer 110a positioned at the uppermost part among the plurality of the conductive layers 110a may be supplied with the read blocking voltage $V_{OFF}$, and the other conductive layers 110a may be supplied with the ground voltage $V_{SS}$, the read pass voltage $V_{READ}$, or another voltage.

In FIG. 34, the read blocking voltage $V_{OFF}$ is supplied to all the conductive layers 110b positioned above the conductive layer 110b functioning as the selected word line WL among the plurality of the conductive layers 110b functioning as the word lines WL. However, such a method is merely an example, and the specific method is appropriately adjustable. For example, only the conductive layer 110b positioned at the lowermost part among the plurality of the conductive layers 110b may be supplied with the read blocking voltage $V_{OFF}$, and the other conductive layers 110b may be supplied with the ground voltage $V_{SS}$, the read pass voltage $V_{READ}$, or another voltage.

At Step S102 (FIG. 33), it is determined whether the electric charge amount of the electrons accumulated at the boundary regions (132a to 132c), (132b to 132c) of the charge storage layer 132 has reached the target value or not. For example, at Step S101, when the current flowing in the bit line BL is larger than the predetermined value, it is determined that the amount of the electrons accumulated at the boundary regions (132a to 132c), (132b to 132c) of the charge storage layer 132 has not reached the target value, and the procedure proceeds to Step S103. For example, at Step S101, when the current flowing in the bit line BL is smaller than the predetermined value, it is determined that the electric charge amount of the electrons accumulated at the boundary regions (132a to 132c), (132b to 132c) of the charge storage layer 132 has reached the target value, and the inter-string region write sequence is terminated.

Figure 36:
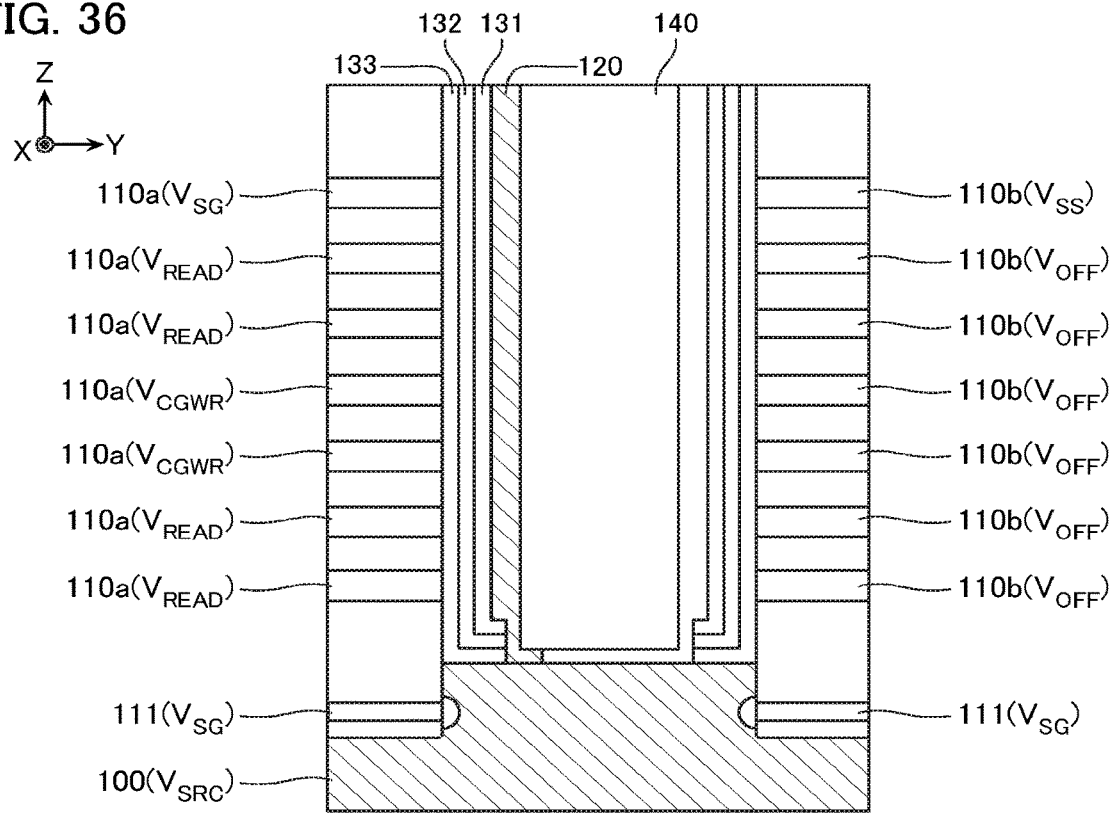
FIG. 36 is a schematic cross-sectional view for describing an inter-word line region read operation according to the first embodiment.

At Step S103, an inter-word line region read operation is executed. FIG. 36 is a schematic cross-sectional view for describing the inter-word line region read operation. Note that, FIG. 36 describes an example of executing the inter-word line region read operation on a predetermined memory cell MC included in the memory string MSa.

As illustrated in FIG. 36, in the inter-word line region read operation, an inter-word line region read voltage $V_{CGWR}$ is supplied to a pair of the conductive layers 110a that function as the selected word lines WL. The pair of conductive layers 110a are, for example, two conductive layers 110a adjacent in the Z-direction. The magnitude of the inter-word line region read voltage $V_{CGWR}$ is appropriately adjustable. The inter-word line region read voltage $V_{CGWR}$ may, for example, be a voltage having a magnitude approximately the same as the ground voltage $V_{SS}$. In the inter-word line region read operation, the read pass voltage $V_{READ}$ is supplied to the other conductive layers 110a that function as the unselected word lines WL, the voltage $V_{SG}$ is supplied to the conductive layer 110a that functions as the drain side select gate line SGD, the read blocking voltage $V_{OFF}$ is supplied to the plurality of the conductive layers 110b that function as the word lines WL, the ground voltage $V_{SS}$ is supplied to the conductive layer 110b that function as the drain side select gate line SGD, the voltage $V_{SG}$ is supplied to the conductive layer 111 that functions as the source side select gate line SGS, and the source voltage $V_{SRC}$ is supplied to the semiconductor substrate 100.

Figure 37:
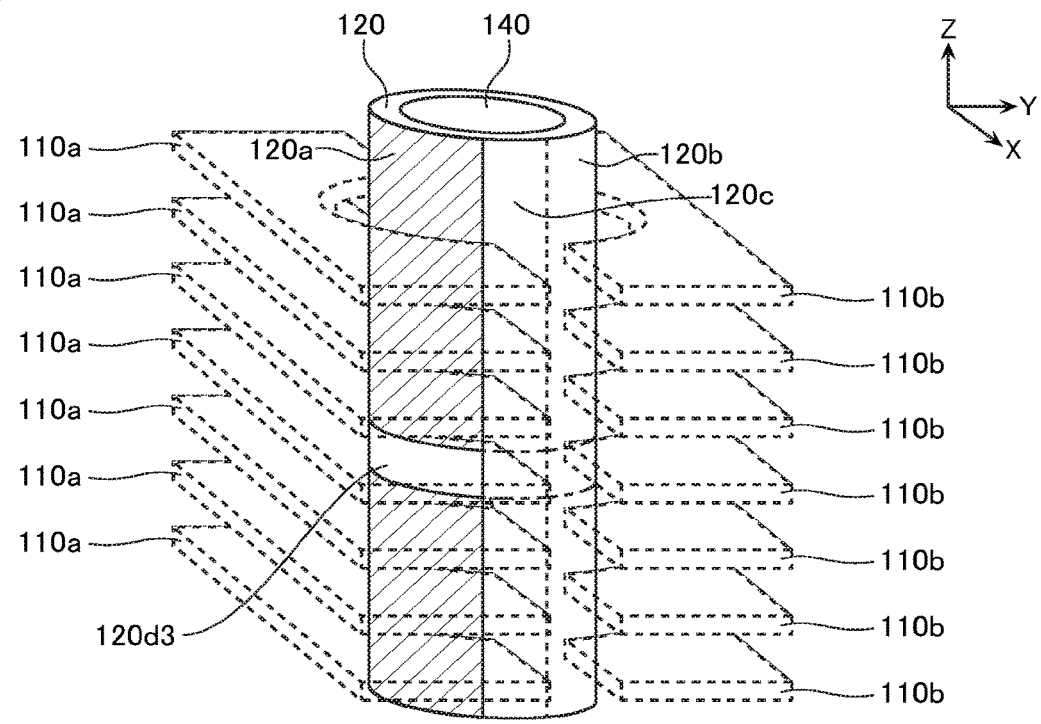
FIG. 37 is a schematic perspective view for describing the inter-word line region read operation according to the first embodiment.

This forms a channel of electrons that electrically conducts the bit line BL with a channel region of the selected memory cell MC (hereinafter may be referred to as a "first selected memory cell") positioned in the upper side of the two selected memory cells MC adjacent in the Z-direction in the semiconductor layer 120, for example, as illustrated in FIG. 37. A channel of electrons that electrically conducts the source line SL with a channel region of the selected memory cell MC (hereinafter may be referred to as a "second selected memory cell") positioned in the lower side of the two selected memory cells MC adjacent in the Z-direction is formed in the semiconductor layer 120. Corresponding to the electric charge amount accumulated in the region 132d3 (FIG. 32) disposed between the first selected memory cell and the second selected memory cell in the charge storage layer 132, a channel of electrons is formed in a region 120d3 on the outer peripheral surface of the semiconductor layer 120 opposed to this region 132d3. This electrically conducts or electrically separates the above-described two channels of electrons. The control circuit CC (FIG. 1), for example, determines whether the electric charge amount accumulated in the region 132d3 of the charge storage layer 132 is larger or smaller than the target value by detecting the magnitude of the voltage of the bit line BL or the magnitude of the current flowing in the bit line BL.

Note that, in FIG. 36, the read blocking voltage $V_{OFF}$ is supplied to all the conductive layers 110b that function as the word lines WL. However, such a method is merely an example, and the specific method is appropriately adjustable. For example, only two conductive layers 110b adjacent in the Y-direction to two conductive layers 110a functioning as the selected word lines WL may be supplied with the read blocking voltage $V_{OFF}$, and the other conductive layers 110b that function as the word lines WL may be supplied with the ground voltage $V_{SS}$, the read pass voltage $V_{READ}$, or another voltage.

At Step S104 (FIG. 33), it is determined whether the electric charge amount of the electrons accumulated in the region 132d3 of the charge storage layer 132 is larger or smaller than the target value. For example, at Step S103, when the current flowing in the bit line BL is larger than the predetermined value, it is determined that the electric charge amount of the electrons accumulated in the region 132d3 of the charge storage layer 132 is smaller than the target value, and the procedure proceeds to Step S105. For example, at Step S103, when the current flowing in the bit line BL is smaller than the predetermined value, it is determined that the electric charge amount of the electrons accumulated in the region 132d3 of the charge storage layer 132 is larger than the target value, and the procedure proceeds to Step S107.

At Step S105, the above-described flash write operation is executed. At Step S106, the above-described erase operation is executed, and the procedure proceeds to Step S101.

At Step S107, the above-described stripe write operation is executed on the even-numbered conductive layers 110a, 110b counted from the lower side. At Step S108, the above-described stripe write operation is executed on the odd-numbered conductive layers 110a, 110b counted from the lower side. At Step S109, the above-described erase operation is executed, and the procedure proceeds to Step S101. Note that an execution order of Step S107 and Step S108 may be inverted.

Other Embodiments

The semiconductor memory device according to the first embodiment has been exemplarily described above. However, the above-mentioned aspect is merely an example, and the specific aspect and the like is appropriately adjustable.

Figure 38:
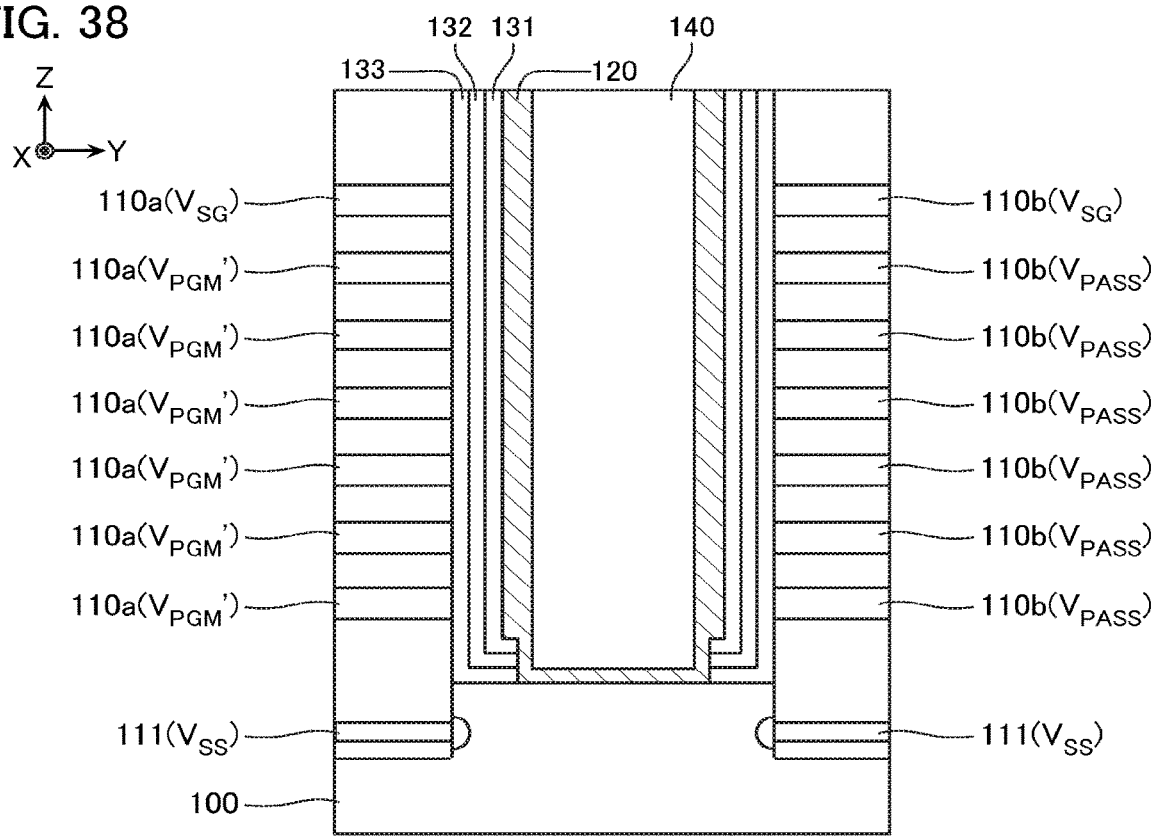
FIG. 38 is a schematic cross-sectional view for describing a flash write operation according to another embodiment.

For example, in the flash write operation described with reference to FIG. 24, the program voltage $V_{PGM}'$ is supplied to both the conductive layer 110a and the conductive layer 110b that function as the word lines WL. However, such a method is merely an example, and the specific method is appropriately adjustable. For example, in the flash write operation, as exemplarily illustrated in FIG. 38, the program voltage $V_{PGM}'$ may be supplied to only one side of the conductive layers 110a or the conductive layers 110b, and the write pass voltage $V_{PASS}$ or the like may be supplied to the other. In such a case, for example, instead of Step S105 described with reference to FIG. 33, the flash write operation on the conductive layers 110a and the flash write operation on the conductive layers 110b may be sequentially executed.

Figure 39:
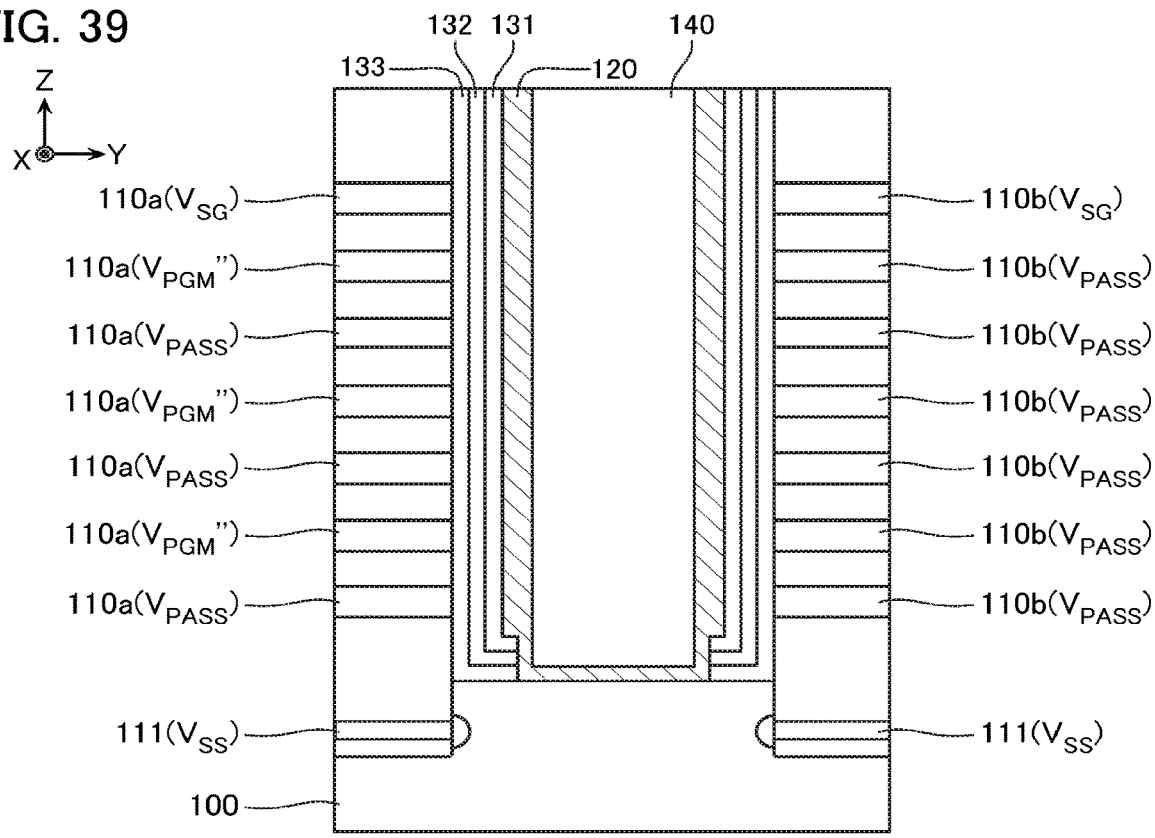
FIG. 39 is a schematic cross-sectional view for describing a stripe write operation according to another embodiment.

For example, in the stripe write operation described with reference to FIG. 27 and FIG. 29, the program voltage $V_{PGM}''$ is supplied to both the conductive layers 110a and the conductive layers 110b that function as the word lines WL. However, such a method is merely an example, and the specific method is appropriately adjustable. For example, in the stripe write operation, as exemplarily illustrated in FIG. 39, the program voltage $V_{PGM}''$ may be supplied to only one side of the conductive layers 110a or the conductive layers 110b, and the write pass voltage $V_{PASS}$ or the like may be supplied to the other. In such a case, for example, instead of Steps S107, S108 described with reference to FIG. 33, the stripe write operation on the even-numbered conductive layers 110a, the stripe write operation on the odd-numbered conductive layers 110a, the stripe write operation on the even-numbered conductive layers 110b, and the stripe write operation on the odd-numbered conductive layers 110b may be sequentially executed.

For example, in the stripe write operation described with reference to FIG. 27 and FIG. 29, the program voltage $V_{PGM}"$ is supplied to 2n-th (n is a natural number) or 2n+1-th conductive layers 110a, 110b counted from the lower side among the plurality of the conductive layers 110a, 110b arranged in the Z-direction, and the write pass voltage $V_{PASS}$ is supplied to the other conductive layers 110a, 110b. However, in the stripe write operation, the program voltage $V_{PGM}"$ may be supplied to 3n-th, 3n+1-th, or 3n+2nd conductive layers 110a, 110b counted from the lower side, and the write pass voltage $V_{PASS}$ may be supplied to the other conductive layers 110a, 110b. Similarly, in the stripe write operation, the program voltage $V_{PGM}"$ may be supplied to any one of mn-th to mn+(m−1)-th (m is a natural number of two or more) conductive layers 110a, 110b counted from the lower side, and the write pass voltage $V_{PASS}$ may be supplied to the other conductive layers 110a, 110b. In such a case, for example, instead of Steps S107, S108 described with reference to FIG. 33, the stripe write operation of m times or 2m times may be sequentially executed.

Figure 40:
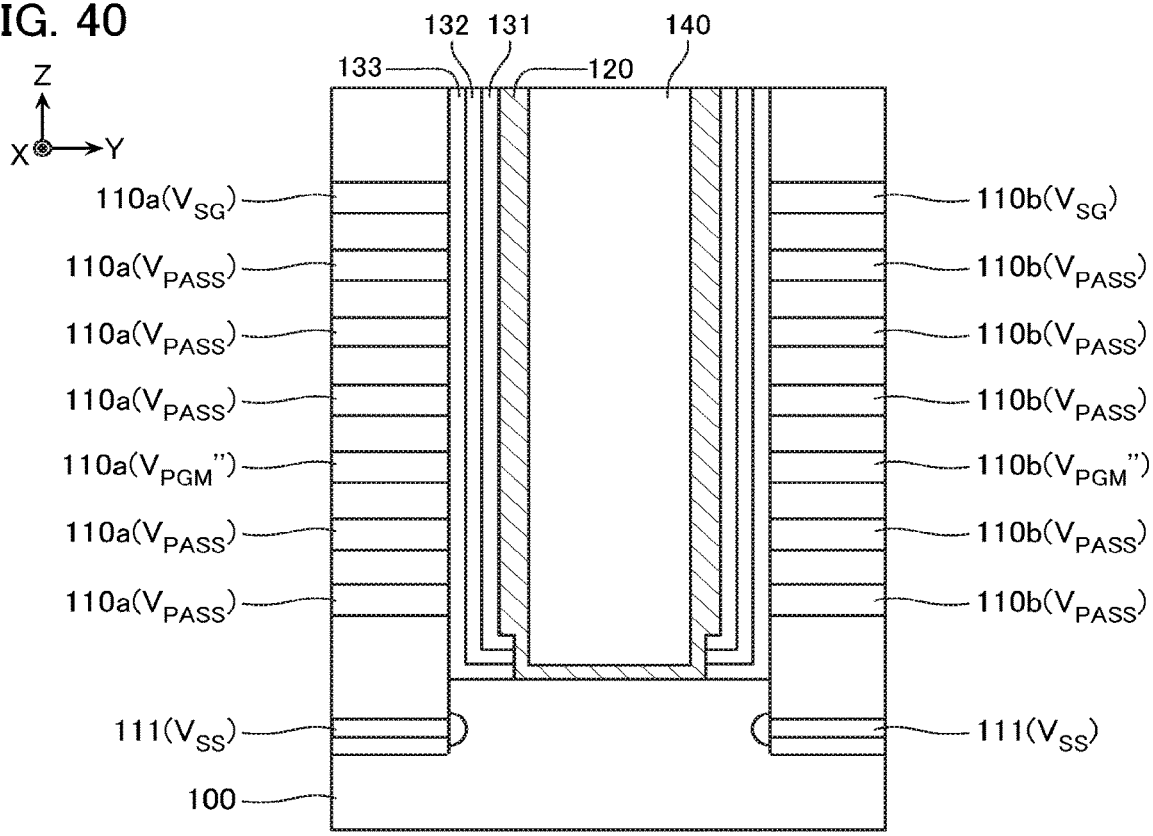
FIG. 40 is a schematic cross-sectional view for describing a stripe write operation according to another embodiment.
Figure 41:
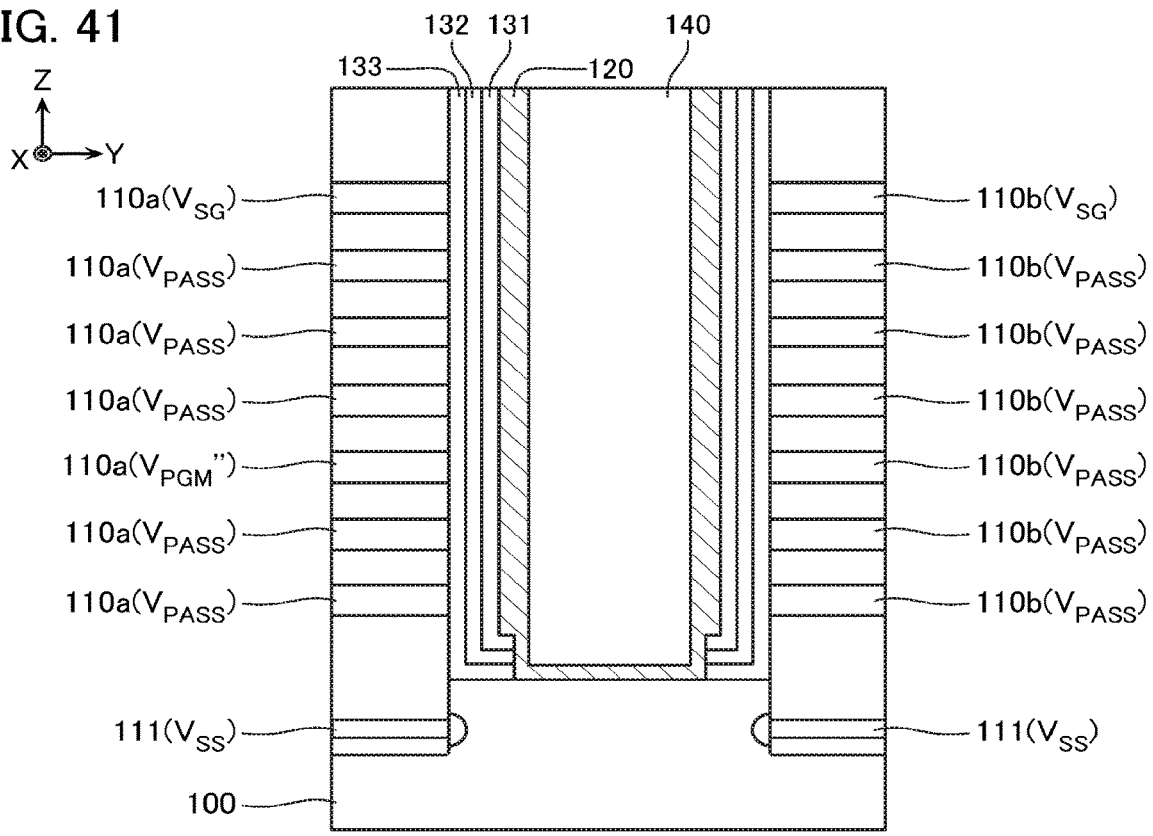
FIG. 41 is a schematic cross-sectional view for describing a stripe write operation according to another embodiment.

Note that, when the above-described m is the same number as the number of the plurality of the conductive layers 110a, 110b arranged in the Z-direction, for example, as illustrated in FIG. 40, the program voltage $V_{PGM}"$ is supplied to one of the plurality of the conductive layers 110a arranged in the Z-direction and one of the plurality of the conductive layers 110b arranged in the Z-direction, and the write pass voltage $V_{PASS}$ is supplied to the other conductive layers 110a, 110b in some cases. For example, as illustrated in FIG. 41, the program voltage $V_{PGM}"$ is supplied to one of the plurality of the conductive layers 110a arranged in the Z-direction or one of the plurality of the conductive layers 110b arranged in the Z-direction, and the write pass voltage $V_{PASS}$ is supplied to the other conductive layers 110a, 110b in some cases.

For example, in the erase operation described with reference to FIG. 21, the ground voltage $V_{SS}$ is supplied to all the conductive layers 110a, 110b that function as the word lines WL. However, such a method is merely an example, and the specific method is appropriately adjustable. For example, in the erase operation, the ground voltage $V_{SS}$ may be supplied to only one side of all the conductive layers 110a functioning as the word lines WL or all the conductive layers 110b functioning as the word lines WL, and the voltage (for example, erase voltage $V_{ERA}$) larger than the ground voltage $V_{SS}$ may be supplied to the other side. In such a case, for example, instead of Steps S106, S109 described with reference to FIG. 33, the erase operation on the conductive layer 110a and the erase operation on the conductive layer 110b may be sequentially executed.

For example, in the erase operation described with reference to FIG. 21, the ground voltage $V_{SS}$ is supplied to all the conductive layers 110a, 110b that function as the word lines WL among the plurality of the conductive layers 110a, 110b arranged in the Z-direction. However, such a method is merely an example, and the specific method is appropriately adjustable. For example, in the erase operation, the ground voltage $V_{SS}$ may be supplied to any one of the mn-th to mn+(m−1)-th (m is a natural number of two or more) conductive layers 110a, 110b counted from the lower side, and the voltage (for example, the erase voltage $V_{ERA}$) larger than the ground voltage $V_{SS}$ may be supplied to the other conductive layers 110a, 110b. In such a case, for example, instead of Steps S106, S109 described with reference to FIG. 33, the erase operation of m times or 2m times may be sequentially executed.

For example, the semiconductor memory device according to the first embodiment is configured to execute the inter-string region write sequence described with reference to FIG. 33. However, such an aspect is merely an example, and the specific aspect is appropriately adjustable.

For example, in the example illustrated in FIG. 33, the procedure returns to Step S101 after executing Step S106 or Step S109, and the inter-string region read operation is executed again. However, for example, after executing Step S106 or Step S109, the inter-string region write sequence may be terminated without returning to Step S101. For example, an upper limit may be set for the repeated number of the steps after Step S101.

Figure 42:
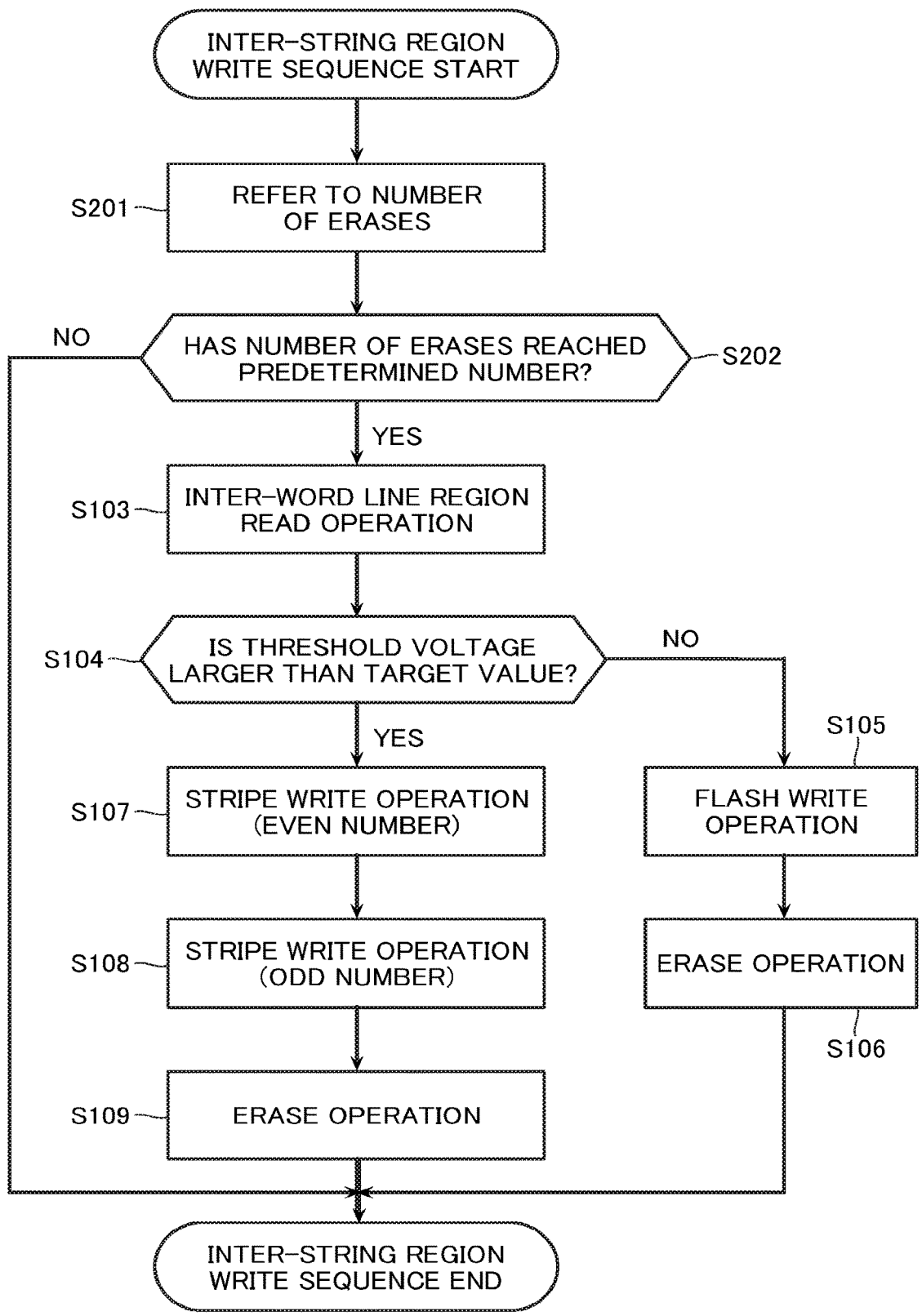
FIG. 42 is a schematic flowchart for describing an inter-string region write sequence according to another embodiment.
Figure 43:
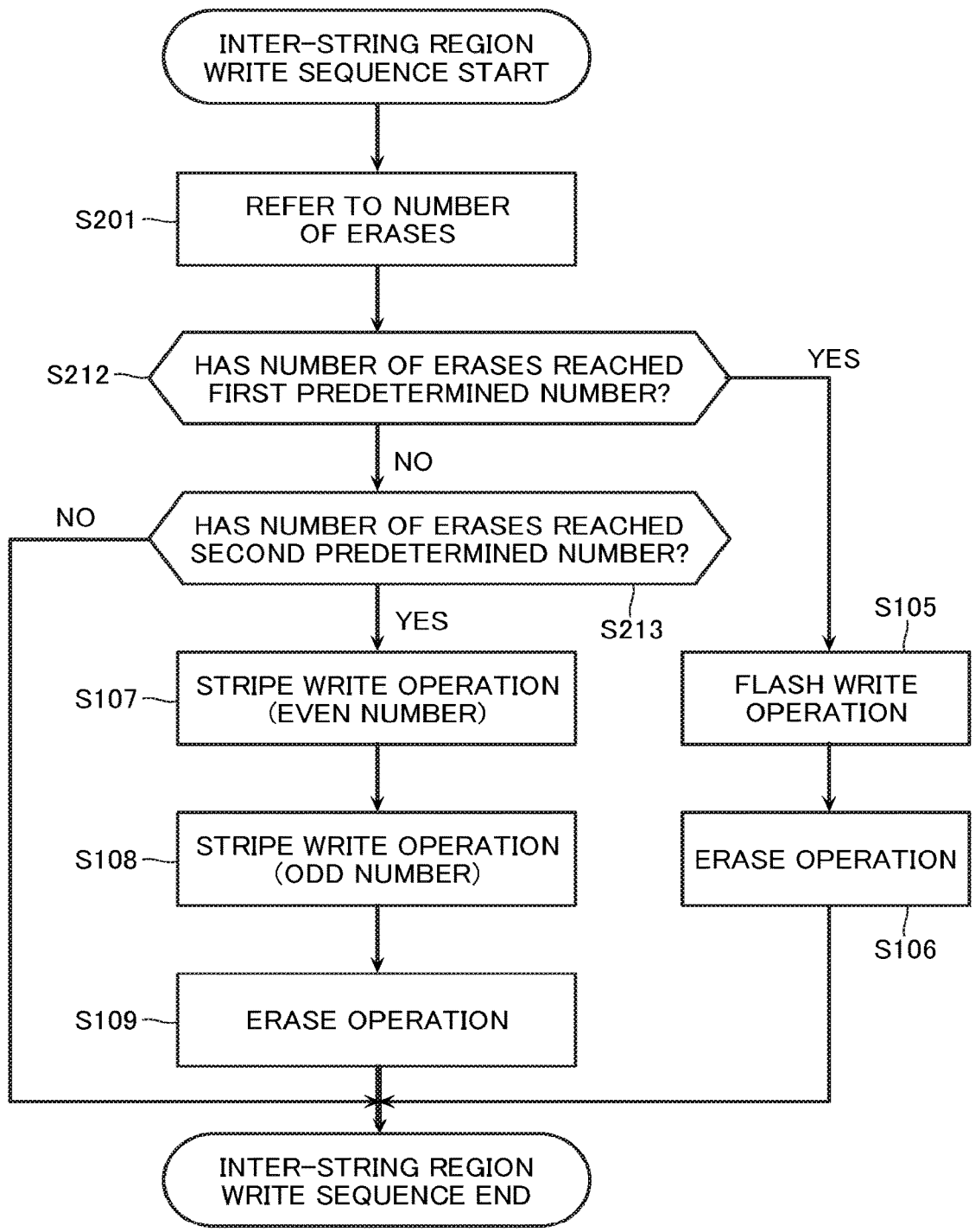
FIG. 43 is a schematic flowchart for describing an inter-string region write sequence according to another embodiment.

For example, in the example illustrated in FIG. 33, at Step S101, the inter-string region read operation is executed, and the necessity of the flash write operation or the stripe write operation is determined corresponding to the result. However, for example, as illustrated in FIG. 42, Step S201 in which the number of executions of the erase operation is referred may be executed instead of Step S101, Step S202 in which the number of erases is determined to have reached the predetermined number or not may be executed instead of Step S102, and when the predetermined number has been reached, the process at and after Step S103 may be executed, and when the predetermined number has not been reached, the inter-string region read operation may be terminated. For example, as illustrated in FIG. 43, Step S201 in which the number of executions of the erase operation is referred may be executed instead of Step S101, Step S212 in which the number of erases is determined to have reached the first predetermined number or not may be executed instead of Step S102, and when the first predetermined number has been reached, Step S105 and Step S106 may be executed, and when the first predetermined number has not been reached, Step S213 may be executed. At Step S213, it is determined whether the number of erases has reached a second predetermined number or not, and when the second predetermined number has been reached, Step S107, Step S108, and Step S109 are executed and when the second predetermined number has not been reached, the inter-string region read operation may be terminated. Note that, the above-described second predetermined number is the number different from the above-described first predetermined number.

The memory die including a configuration as described with reference to FIG. 1 to FIG. 3 may be configured to automatically execute all the steps described with reference to FIG. 33, FIG. 42, and FIG. 43 in response to an input or the like of a command set from outside or may be configured to individually execute one or a plurality of steps in response to an input or the like of a command set from outside. For example, Steps S201, S202, S212, and S213 described with reference to FIG. 42 and FIG. 43 may be executed by the control die that controls the memory die. In such a case, the control die may refer to a table or the like of the number of erases used for wear leveling and the like at Step S201 described with reference to FIG. 42 and FIG. 43. Note that, the memory die and the control die may be included in one package or may be included in different packages.

The above-described example has described the example where the semiconductor memory device is configured to execute both the flash write operation and the stripe write operation. However, the semiconductor memory device may be configured to execute only one of the flash write operation and the stripe write operation.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of first conductive layers arranged in a first direction;
   a plurality of second conductive layers spaced from the plurality of first conductive layers in a second direction intersecting with the first direction, the second conductive layers being arranged in the first direction;
   a semiconductor layer disposed between the plurality of first conductive layers and the plurality of second conductive layers, the semiconductor layer extending in the first direction and opposing the plurality of first conductive layers and the plurality of second conductive layers; and
   a charge storage layer including a first part and a second part, the first part being disposed between the plurality of first conductive layers and the semiconductor layer, the second part being disposed between the plurality of second conductive layers and the semiconductor layer, wherein
   the semiconductor memory device is configured to execute:
      a first write operation in which a first program voltage is supplied to a third conductive layer which is one of the plurality of first conductive layers, and a write pass voltage smaller than the first program voltage is supplied to a fourth conductive layer which is another of the plurality of first conductive layers; and
      a second write operation in which a second program voltage larger than the write pass voltage is supplied to the third conductive layer, and the second program voltage is supplied to the fourth conductive layer.

2. The semiconductor memory device according to claim 1, wherein
   in the first write operation, the write pass voltage is supplied to a fifth conductive layer which is one of the plurality of first conductive layers, the fifth conductive layer being adjacent to the third conductive layer in the first direction, and
   in the second write operation, the second program voltage is supplied to the fifth conductive layer.

3. The semiconductor memory device according to claim 1, wherein
   in the first write operation, the write pass voltage is supplied to a fifth conductive layer which is one of the plurality of first conductive layers, the fifth conductive layer being adjacent to the third conductive layer in the first direction, and
   in the second write operation, the write pass voltage is supplied to the fifth conductive layer.

4. The semiconductor memory device according to claim 1, wherein
   in the first write operation, the write pass voltage is supplied to a sixth conductive layer which is one of the plurality of second conductive layers, and
   in the second write operation, the second program voltage is supplied to the sixth conductive layer.

5. The semiconductor memory device according to claim 1, wherein
   in the first write operation, the write pass voltage is supplied to a sixth conductive layer which is one of the plurality of second conductive layers, and
   in the second write operation, the write pass voltage or a voltage smaller than the write pass voltage is supplied to the sixth conductive layer.

6. The semiconductor memory device according to claim 1, comprising
   a first wiring electrically connected to the semiconductor layer, wherein
   the semiconductor memory device is configured to:
      execute an erase operation in which an erase voltage larger than the write pass voltage is supplied to the first wiring, and a first voltage smaller than the erase voltage is supplied to the third conductive layer and the fourth conductive layer; and
      execute a first sequence including the second write operation and the erase operation.

7. The semiconductor memory device according to claim 6, wherein
   the semiconductor memory device is configured to execute a first read operation and a second read operation,
   in the first read operation:
      a first read voltage is supplied to the third conductive layer;
      a read pass voltage larger than the first read voltage is supplied to the fourth conductive layer; and
      the read pass voltage is supplied to a fifth conductive layer which is one of the plurality of first conductive layers, the fifth conductive layer being adjacent to the third conductive layer in the first direction,
   in the second read operation:
      a second read voltage smaller than the read pass voltage is supplied to the third conductive layer;
      the read pass voltage is supplied to the fourth conductive layer; and
      the second read voltage is supplied to the fifth conductive layer, wherein
   the first sequence includes the second read operation.

8. The semiconductor memory device according to claim 7, wherein
   in the first read operation, a read blocking voltage smaller than the first read voltage and the second read voltage is supplied to a sixth conductive layer which is one of the plurality of second conductive layers, and
   in the second read operation, the read blocking voltage is supplied to the sixth conductive layer.

9. The semiconductor memory device according to claim 6, wherein
   the semiconductor memory device is configured to execute a first read operation and a third read operation,
   in the first read operation:
      a first read voltage is supplied to the third conductive layer;
      a read pass voltage larger than the first read voltage is supplied to the fourth conductive layer;
      the read pass voltage is supplied to a ninth conductive layer which is one of the plurality of first conductive layers, the third conductive layer being positioned between the fourth conductive layer and the ninth conductive layer; and a read blocking voltage smaller than the first read voltage is supplied to a tenth conductive layer which is one of the plurality of second conductive layers, the tenth conductive layer being arranged with the third conductive layer in the second direction, in the third read operation:
a third read voltage larger than the first read voltage is supplied to the third conductive layer;
the read pass voltage is supplied to the fourth conductive layer;
the read blocking voltage is supplied to the ninth conductive layer;
the third read voltage is supplied to the tenth conductive layer;
the read blocking voltage is supplied to an eleventh conductive layer which is one of the plurality of second conductive layers, the eleventh conductive layer being arranged with the fourth conductive layer in the second direction; and
the read pass voltage is supplied to a twelfth conductive layer which is one of the plurality of second conductive layers, the twelfth conductive layer being arranged with the ninth conductive layer in the second direction, wherein
the first sequence includes the third read operation.

10. A semiconductor memory device comprising:
a plurality of first conductive layers arranged in a first direction;
a plurality of second conductive layers spaced from the plurality of first conductive layers in a second direction intersecting with the first direction, the second conductive layers being arranged in the first direction;
a semiconductor layer disposed between the plurality of first conductive layers and the plurality of second conductive layers, the semiconductor layer extending in the first direction and opposing the plurality of first conductive layers and the plurality of second conductive layers;
a charge storage layer including a first part and a second part, the first part being disposed between the plurality of first conductive layers and the semiconductor layer, the second part being disposed between the plurality of second conductive layers and the semiconductor layer; and
a first wiring electrically connected to the semiconductor layer, wherein the semiconductor memory device is configured to execute:
a first write operation in which a first program voltage is supplied to a third conductive layer which is one of the plurality of first conductive layers, and a write pass voltage smaller than the first program voltage is supplied to a fourth conductive layer which is another of the plurality of first conductive layers;
a second write operation in which the write pass voltage is supplied to the third conductive layer, and the first program voltage is supplied to the fourth conductive layer; and
an erase operation in which an erase voltage larger than the write pass voltage is supplied to the first wiring, and a first voltage smaller than the erase voltage is supplied to the third conductive layer and the fourth conductive layer, and the semiconductor memory device is configured to execute a first sequence including the first write operation, the second write operation, and the erase operation.

11. The semiconductor memory device according to claim 10, wherein
the semiconductor memory device is configured to execute a third write operation in which a second program voltage larger than the write pass voltage is supplied to the third conductive layer, and the second program voltage is supplied to the fourth conductive layer, and
the first sequence includes the third write operation in addition to the first write operation, the second write operation, and the erase operation.

12. The semiconductor memory device according to claim 11, wherein
in the first sequence, the erase operation is executed after executing the first write operation and the second write operation or after executing the third write operation.

13. The semiconductor memory device according to claim 10, wherein
in the first write operation:
the first program voltage is supplied to a seventh conductive layer which is one of the plurality of first conductive layers, the seventh conductive layer being positioned between the third conductive layer and the fourth conductive layer, and
the write pass voltage is supplied to an eighth conductive layer which is one of the plurality of first conductive layers, the eighth conductive layer being positioned between the third conductive layer and the seventh conductive layer,
in the second write operation:
the write pass voltage is supplied to the seventh conductive layer, and
the first program voltage is supplied to the eighth conductive layer.

14. The semiconductor memory device according to claim 10, wherein
the semiconductor memory device is configured to execute a first read operation and a second read operation,
in the first read operation:
a first read voltage is supplied to the third conductive layer;
a read pass voltage larger than the first read voltage is supplied to the fourth conductive layer; and
the read pass voltage is supplied to a fifth conductive layer which is one of the plurality of first conductive layers, the fifth conductive layer being adjacent to the third conductive layer in the first direction,
in the second read operation:
a second read voltage smaller than the read pass voltage is supplied to the third conductive layer;
the read pass voltage is supplied to the fourth conductive layer; and
the second read voltage is supplied to the fifth conductive layer, wherein
the first sequence includes the second read operation.

15. The semiconductor memory device according to claim 14, wherein
in the first read operation, a read blocking voltage smaller than the first read voltage and the second read voltage is supplied to a sixth conductive layer which is one of the plurality of second conductive layers, and in the second read operation, the read blocking voltage is supplied to the sixth conductive layer.

16. The semiconductor memory device according to claim 10, wherein
the semiconductor memory device is configured to execute a first read operation and a third read operation,
in the first read operation:
a first read voltage is supplied to the third conductive layer;
a read pass voltage larger than the first read voltage is supplied to the fourth conductive layer;
the read pass voltage is supplied to a ninth conductive layer which is one of the plurality of first conductive layers, the third conductive layer being positioned between the fourth conductive layer and the ninth conductive layer; and
a read blocking voltage smaller than the first read voltage is supplied to a tenth conductive layer which is one of the plurality of second conductive layers, the tenth conductive layer being arranged with the third conductive layer in the second direction;
in the third read operation:
a third read voltage larger than the first read voltage is supplied to the third conductive layer;
the read pass voltage is supplied to the fourth conductive layer;
the read blocking voltage is supplied to the ninth conductive layer;
the third read voltage is supplied to the tenth conductive layer;
the read blocking voltage is supplied to an eleventh conductive layer which is one of the plurality of second conductive layers, the eleventh conductive layer being arranged with the fourth conductive layer in the second direction; and
the read pass voltage is supplied to a twelfth conductive layer which is one of the plurality of second conductive layers, the twelfth conductive layer being arranged with the ninth conductive layer in the second direction, wherein
the first sequence includes the third read operation.

17. A semiconductor memory device comprising:
a plurality of first conductive layers arranged in a first direction;
a plurality of second conductive layers spaced from the plurality of first conductive layers in a second direction intersecting with the first direction, the second conductive layers being arranged in the first direction;
a semiconductor layer disposed between the plurality of first conductive layers and the plurality of second conductive layers, the semiconductor layer extending in the first direction and opposing the plurality of first conductive layers and the plurality of second conductive layers; and
a charge storage layer including a first part and a second part, the first part being disposed between the plurality of first conductive layers and the semiconductor layer, the second part being disposed between the plurality of second conductive layers and the semiconductor layer, wherein
the semiconductor memory device is configured to execute a first read operation and a second read operation,
in the first read operation:
a first read voltage is supplied to a third conductive layer which is one of the plurality of first conductive layers;
a read pass voltage larger than the first read voltage is supplied to a fourth conductive layer which is another of the plurality of first conductive layers; and
the read pass voltage is supplied to a fifth conductive layer which is one of the plurality of first conductive layers, the fifth conductive layer being adjacent to the third conductive layer in the first direction,
in the second read operation:
a second read voltage smaller than the read pass voltage is supplied to the third conductive layer;
the read pass voltage is supplied to the fourth conductive layer; and
the second read voltage is supplied to the fifth conductive layer.

18. A semiconductor memory device comprising:
a plurality of first conductive layers arranged in a first direction;
a plurality of second conductive layers spaced from the plurality of first conductive layers in a second direction intersecting with the first direction, the second conductive layers being arranged in the first direction;
a semiconductor layer disposed between the plurality of first conductive layers and the plurality of second conductive layers, the semiconductor layer extending in the first direction and opposing the plurality of first conductive layers and the plurality of second conductive layers; and
a charge storage layer including a first part and a second part, the first part being disposed between the plurality of first conductive layers and the semiconductor layer, the second part being disposed between the plurality of second conductive layers and the semiconductor layer, wherein
the semiconductor memory device is configured to execute a first read operation and a second read operation,
in the first read operation:
a first read voltage is supplied to a third conductive layer which is one of the plurality of first conductive layers;
a read pass voltage larger than the first read voltage is supplied to a fourth conductive layer which is another of the plurality of first conductive layers;
the read pass voltage is supplied to a fifth conductive layer which is one of the plurality of first conductive layers, the third conductive layer being positioned between the fourth conductive layer and the fifth conductive layer; and
a read blocking voltage smaller than the first read voltage is supplied to a sixth conductive layer which is one of the plurality of second conductive layers, the sixth conductive layer being arranged with the third conductive layer in the second direction,
in the second read operation:
a second read voltage larger than the first read voltage is supplied to the third conductive layer;
the read pass voltage is supplied to the fourth conductive layer;
the read blocking voltage is supplied to the fifth conductive layer;
the second read voltage is supplied to the sixth conductive layer;
the read blocking voltage is supplied to a seventh conductive layer which is one of the plurality of second conductive layers, the seventh conductive layer being arranged with the fourth conductive layer in the second direction;

the read pass voltage is supplied to an eighth conductive layer which is one of the plurality of second conductive layers, the eighth conductive layer being arranged with the fifth conductive layer in the second direction.

* * * * *